(12) United States Patent
Kako

(10) Patent No.: US 9,496,527 B2
(45) Date of Patent: Nov. 15, 2016

(54) VACUUM DEPOSITION DEVICE AND METHOD OF MANUFACTURING ORGANIC EL DEVICE

(71) Applicant: Kaneka Corporation, Osaka-shi, Osaka (JP)

(72) Inventor: Shuhei Kako, Takasago (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/421,418

(22) PCT Filed: Aug. 2, 2013

(86) PCT No.: PCT/JP2013/071038
§ 371 (c)(1),
(2) Date: Feb. 12, 2015

(87) PCT Pub. No.: WO2014/027578
PCT Pub. Date: Feb. 20, 2014

(65) Prior Publication Data
US 2015/0221897 A1 Aug. 6, 2015

(30) Foreign Application Priority Data
Aug. 13, 2012 (JP) .................. 2012-179466

(51) Int. Cl.
*G01R 31/26* (2014.01)
*H01L 51/56* (2006.01)
(Continued)

(52) U.S. Cl.
CPC ............. *H01L 51/56* (2013.01); *B05B 12/084* (2013.01); *B05B 17/00* (2013.01); *C23C 14/12* (2013.01); *C23C 14/24* (2013.01); *C23C 14/243* (2013.01); *C23C 14/545* (2013.01); *H01L 51/001* (2013.01)

(58) Field of Classification Search
CPC ........... H01L 2924/00; H01L 27/1292; H01L 29/66765; H01L 2224/48227; H01L 2224/48465; H01L 2924/00012; H01L 2924/00014; H01L 51/56; H01L 2224/32225; H01L 2224/48091; H01L 2224/73265; H01L 27/12
See application file for complete search history.

(56) References Cited

U.S. PATENT DOCUMENTS

| 2003/0203638 A1 | 10/2003 | Van Slyke |
| 2006/0045958 A1 | 3/2006 | Abiko et al. |
| 2007/0231490 A1 | 10/2007 | Boroson et al. |
| 2010/0269755 A1 | 10/2010 | Nagata |

FOREIGN PATENT DOCUMENTS

| JP | 2003155555 A | 5/2003 |
| JP | 2003317957 A | 11/2003 |

(Continued)

OTHER PUBLICATIONS

International Bureau of WIPO, International Preliminary Report on Patentability Issued in Application No. PCT/JP2013/071038, Feb. 26, 2015, WIPO, 12 pages.

(Continued)

*Primary Examiner* — Robert Bachner
(74) *Attorney, Agent, or Firm* — Alleman Hall McCoy Russell & Tuttle LLP

(57) ABSTRACT

The present invention relates to a vacuum deposition device that includes a film forming chamber and a series of discharge circuit which evaporates the film forming materials and discharges the evaporated film forming materials toward a substrate. The discharge circuit is constituted of: evaporating parts, a manifold group; a film forming material discharge part; and a shutter member. In the film forming material discharge part, discharge openings which are communicated with manifold portions are distributed. Flow restrictions are provided in the vicinity of open ends of the discharge openings. Open areas of the flow restrictions differ from each other for the respective manifold portions. Consideration is taken such that the film forming materials which are formed into layers having similar film thicknesses are filled into the evaporating parts belonging to the same group.

5 Claims, 17 Drawing Sheets

(51) Int. Cl.

| | | |
|---|---|---|
| *C23C 14/24* | (2006.01) | |
| *C23C 14/54* | (2006.01) | |
| *B05B 12/08* | (2006.01) | |
| *B05B 17/00* | (2006.01) | |
| *H01L 51/00* | (2006.01) | |
| *C23C 14/12* | (2006.01) | |

(56) References Cited

FOREIGN PATENT DOCUMENTS

| JP | 2008075095 A | 4/2008 |
|----|--------------|--------|
| JP | 2008156724 A | 7/2008 |
| JP | 2009531550 A | 9/2009 |
| JP | 2009256705 A | 11/2009 |
| JP | 2011256427 A | 12/2011 |
| WO | 2009060739 A1 | 5/2009 |
| WO | 2011071064 A1 | 6/2011 |

OTHER PUBLICATIONS

ISA Japanese Patent Office, International Search Report of PCT/JP2013/071038, WIPO, Oct. 22, 2013, 2 pages.

European Patent Office, Supplementary European Search Report Issued in Application No. EP13879619, Search Completed Mar. 9, 2016, Netherlands, 2 pages.

VACUUM DEPOSITION DEVICE AND METHOD OF MANUFACTURING ORGANIC EL DEVICE

TECHNICAL FIELD

The present invention relates to a vacuum deposition device, and more particularly to a vacuum deposition device which can form a plurality of film forming layers in one film forming chamber. The vacuum deposition device according to the present invention is suitable as a device for manufacturing an organic EL (Electro Luminescence) device. The present invention also relates to a method of manufacturing an organic EL device.

BACKGROUND ART

Recently, organic EL devices have been attracting attention as illumination devices which replace incandescent lamps and fluorescent lamps, and many studies have been made concerning these organic EL devices. An organic EL device is configured such that organic EL elements are laminated on a substrate such as a glass substrate or a transparent resin film.

The organic EL element is configured such that two electrodes where at least one of them has light transmitting property face each other in an opposed manner, and a light emitting layer made of an organic compound is laminated between these electrodes.

An organic EL device is a self-luminous device and can emit light having various wavelengths by suitably selecting a material for forming the light emitting layer. Further, the light emitting layer is extremely thin compared to an incandescent lamp and a fluorescent lamp and emits light in plane and hence, the restriction imposed on the installation place is small.

The layer constitution of a typical organic EL device is shown in FIG. 21. The organic EL device 200 shown FIG. 21 is configured such that a transparent electrode layer 203, a functional layer 205 and a back surface electrode layer 206 are laminated on a glass substrate 202, and these parts are sealed by a sealing part 207. The organic EL device 200 adopts a so-called bottom emission type constitution where light is drawn from a glass substrate 202 side.

Further, the functional layer 205 is formed by laminating a plurality of films formed using an organic compound or a conductive oxide film. The typical layer constitution of the functional layer 205 is configured such that, as shown in an enlarged view of FIG. 21, the functional layer 205 includes, in order from a transparent electrode layer 203 side, a hole-injection layer 208, a hole transport layer 210, a light emitting layer 211, an electron transport layer 212, and an electron-injection layer 215.

In this manner, an organic EL device is manufactured by sequentially forming the above-mentioned layers on the glass substrate 202.

With respect to the layers described above, the functional layer 205 is a layer formed by laminating a plurality of thin films made of organic compounds and all thin films are formed into films by a vacuum deposition method.

That is, as described previously, the functional layer 205 is formed by laminating the plurality of thin films made of organic compounds and hence, it is necessary to perform the vapor deposition plural times to form the functional layer 205.

Further, the back surface electrode layer 206 is, in general, formed of a thin film made of metal such as aluminum or silver, and is formed by a vacuum deposition method in the same manner as the functional layer 205.

Accordingly, in manufacturing just one organic EL device, it is necessary to perform the vapor deposition many times.

The conventional vacuum deposition device can vapor-deposit only one kind of thin film. For example, while the functional layer 205 of the organic EL device is constituted of the hole-injection layer 208, the hole transport layer 210, the light emitting layer 211, the electron transport layer 212 and the electron-injection layer 215, in the conventional method, these layers are formed by using separate vacuum deposition devices.

Accordingly, in the formation of the films of layers of the conventional organic EL device, it is necessary to frequently perform works of conveying the substrate into and out of the vacuum deposition device. As a result, a work efficiency of the conventional method is low and there has been a demand for improvement of the formation of the layers of the organic EL device.

As a countermeasure to overcome this drawback, there has been proposed a vacuum deposition device where a plurality of thin film layers can be formed using one film forming chamber in patent documents 1 and 2.

In the vacuum deposition device disclosed in patent documents 1 and 2, three diffusion containers are disposed in a film forming chamber.

A plurality of evaporating parts are connected to each diffusion device, and vapor of film forming materials is supplied to each diffusion containers from the respective evaporating parts. Then, vapor of film forming material (hereinafter referred to as "film forming vapor") is discharged into the film forming chamber from each diffusion container and a film is formed on a substrate.

In the vacuum deposition device disclosed in patent documents 1, 2, a plurality of thin film layers can be formed in one film forming chamber by selecting the diffusion container into which a film forming vapor is to be discharged.

Further, in the vacuum deposition device disclosed in patent documents 1, 2, a film forming material supplied to the diffusion container can be changed by switching the evaporating part to be used. That is, in the vacuum deposition device disclosed in patent documents 1, 2, a plurality of thin film layers can be formed in one film forming chamber.

In patent document 1, as a unit for grouping film forming materials, there is disclosed a method where film forming materials having similar evaporation temperatures or similar limit temperatures are formed into a group. That is, as to the vacuum deposition device disclosed in patent document 1 where a plurality of evaporating parts are connected to each diffusion device, an interesting observation is made with respect to which evaporating part is to be used and which film forming material is to be evaporated.

In other words, patent document 1 discloses the preferred combinations of the evaporators and the film forming materials.

The method disclosed in patent document 1 is characterized in that film forming materials are divided into groups depending on evaporation temperatures and limit temperatures thereof, and the film forming materials having similar evaporation temperatures are charged into any one of a plurality of evaporating parts which are connected to the same diffusion device and are evaporated.

PRIOR ART DOCUMENT

Patent Document

Patent document 1: JP2008-75095A
Patent document 2: JP2009-256705A

DISCLOSURE OF INVENTION

Technical Problem

The method disclosed in patent document theoretically has no problem and it is safe to say that this method is one of methods of combining the evaporators and film forming materials.

However, this method is less than optimal, and there has been a demand for the more desirable method of combining the evaporators and film forming materials.

The present invention relates to a vacuum deposition device provided with a plurality of evaporators, and it is an object of the present invention to provide the preferred combinations of evaporators and film forming materials.

It is another object of the present invention to provide a method of manufacturing an organic EL device where the distribution of thicknesses of formed thin films can be made uniform at the time of forming a plurality of layers of the organic EL device using one film forming chamber.

Solution to Problem

An organic EL device is constituted by laminating a plurality of thin film layers as described above. It is desirable that any one of these layers is formed as a film having the uniform distribution of film thickness. That is, it is desirable that each layer has the uniform thickness and each layer minimally exhibits irregularity in thickness depending on portions of the layer.

To make the film thickness of each layer uniform, it is necessary to perform film forming of each layer under optimum conditions. However, in an actual operation, the thicknesses of respective layers which form the organic EL device are not uniform. Accordingly, optimum conditions for forming each film having a uniform thickness differ for every layer.

As one of conditions necessary for making the film thickness of each layer uniform, a discharge amount of film forming vapor per unit time is named. That is, in a vacuum deposition method, it is necessary to appropriately adjust an amount of film forming vapor discharged through a discharge opening per unit time. An inappropriate discharge amount of film forming vapor results in an irregularity in film thickness of a formed film.

In view of the above, according to the present invention, evaporators and film forming materials are combined by using "target discharge quantities of vapor per unit time for individual film forming materials" as the reference.

That is, when the same discharge system is used, it is expected that the flow resistances that the respective film forming vapor receives are substantially equal. Accordingly, by evaporating the film forming materials having substantially the similar "target discharge quantities of vapor per unit time for individual film forming materials" in the evaporating part belonging to the same system, discharge quantities of film forming vapor per unit time become substantially equal.

According to one aspect of the present invention completed based on the above-mentioned studies, there is provided a vacuum deposition device including: a film forming chamber where a pressure is reducible and a substrate is disposed; and a film forming material discharge part having a plurality of discharge openings for discharging vapor of a film forming material to the substrate, and forming a film on the substrate by discharging the vapor of the film forming material from the film forming material discharge part, wherein a plurality of evaporating parts which evaporate a film forming material are provided, one discharge system is formed by connecting one set of evaporating part group which is constituted of one or a plurality of evaporating parts and one set of opening group which is constituted of a plurality of discharge openings, and a flow passage constitution where a plurality of the discharge systems exist is provided, and a main open-close valve is provided for every evaporating part, vapor generated in the evaporating part by opening the main open-close valve is introduced into the film forming material discharge part, and the vapor of the film forming material is discharged to the substrate from the film forming material discharge part, thus forming a film on the substrate, wherein the evaporating part group is selected such that the evaporating parts where the individual film forming materials have substantially similar target discharge quantities of vapor per unit time form one group.

In one preferred aspect of the present invention, a flow restriction is positioned in the vicinity of an open end of each of the discharge openings from the evaporating parts, one flow restriction disposed in one discharge system has an open area thereof determined based on a fixed reference, and another flow restriction disposed in at least one other discharge system has an open area thereof determined based on a different reference.

According to this aspect, the open area can be made different for every discharge system and hence, a discharge amount of film forming vapor per unit time can be made to approximate an ideal state.

In one preferred aspect of the present invention, the discharge openings which belong to each opening group have substantially the same open area.

"Have substantially the same open areas" means that the difference in open area is within ±5%. It goes without saying that "have substantially the same open areas" means "have the same open area".

In this aspect, it is more preferable that the difference in open area be within ±3%.

In one preferred aspect of the present invention, the discharge openings having different open areas are mixed in the discharge openings which belong to each opening group.

In one preferred aspect of the present invention, the total areas of the discharge openings belonging to the respective opening groups differ from each other.

According to this aspect, a film forming amount per unit time can be controlled for every opening group.

In one preferred aspect of the present invention, the discharge openings which are arranged adjacent to the discharge opening belonging to one opening group are all discharge openings which belong to the different opening group.

According to this aspect, one discharge opening and the discharge opening arranged adjacent to the one discharge opening belong to the different opening groups and hence, the discharge openings which belong to the respective opening groups can be uniformly distributed.

In one preferred aspect of the present invention, the vacuum deposition device comprises a heat medium flow passage which adjusts a temperature of the whole or a part of the discharge system.

The heat medium which is made to pass through the heat medium flow passage may not be limited to a high-temperature heat medium but may be a low-temperature heat medium. For example, assuming the case where a film forming material having a high vaporization temperature is discharged and, thereafter, a film forming material having a low vaporization temperature is discharged using the same discharge system, it is necessary to cool the discharge system such as a manifold.

In this aspect, the vacuum deposition device includes the heat medium flow passage which adjusts a temperature of all or a part of the discharge system and hence, it is also possible to cool the discharge system, whereby the vapor deposition of a film forming material which vaporizes at a low temperature can be started earlier. Further, this aspect can shorten a switching time of film forming materials to be discharged.

It is needless to say that the heat medium flow passage allows a high temperature heat medium to pass therethrough.

In one preferred aspect of the present invention, a film thickness sensor and a checking discharge opening for checking a film thickness are disposed in the inside of the film forming chamber, and the discharge system and the checking discharge opening for checking the film thickness are communicated with each other.

According to the vapor deposition device of this aspect, the thickness of the film laminated on the substrate can be accurately detected.

In one preferred aspect of the present invention, each of the discharge openings is communicated with an inner space of a manifold portion directly or by way of an extension pipe, and one or a plurality of manifold portions are partially or wholly disposed outside the film forming chamber.

According to this aspect, one or a plurality of manifold portions are partially or wholly disposed outside the film forming chamber and hence, a volume of the film forming chamber can be relatively decreased. Accordingly, in creating a vacuum atmosphere in the film forming chamber, a time for creating a vacuum in the inside of the film forming chamber can be shortened compared to conventional vacuum deposition devices. Accordingly, a film forming amount per unit time can be increased.

In one preferred aspect of the present invention, each of the discharge openings is communicated with an inner space of a manifold portion directly or by way of an extension pipe, one or a plurality of manifold portions are partially or wholly disposed outside the film forming chamber, a film thickness sensor and a checking discharge opening for checking a film thickness are disposed in the inside of the film forming chamber, and the manifold portion disposed outside the film forming chamber and the checking discharge opening for checking a film thickness are communicated with each other.

According to this aspect, the film thickness sensor is disposed in the inside of the film forming chamber and hence, it is unnecessary to newly provide a space for the film thickness sensor. Accordingly, a facility cost can be reduced.

In one preferred aspect of the present invention, each of the discharge openings is communicated with an inner space of the manifold portion directly or by way of an extension pipe, the manifold portion includes a residual vapor removing unit, and the residual vapor removing unit is capable of changing the property of vapor of a film forming material remaining in the inside of the manifold portion by lowering a temperature of a part of the manifold portion after forming the film.

"Property" expresses properties or a state of a material, and "property is changed" means, for example, a change in composition, a change in physical property, a change in shape or a change in state.

According to this aspect, vapor of a film forming material is solidified or liquefied by cooling using the residual vapor removing unit, thus removing vapor of the film forming material.

Vapor of a film forming material immediately after operating the vacuum deposition device exhibits an insufficient reaction and hence, it is often the case that vapor is unstable.

Accordingly, in one preferred aspect of the present invention, the vacuum deposition device includes a shutter member which covers all discharge openings formed in the film forming material discharge part, the shutter member is movable relative to the discharge openings and has openings, the shutter member is capable of bringing all discharge openings into an open state by making the openings formed in the shutter member agree with the discharge openings and, the shutter member is capable of bringing all discharge openings into a closed state by making the openings formed in the shutter member displaced from the discharge openings.

According to this aspect, immediately after the operation of the vacuum deposition device, by bringing the shutter member into a closed state, it is possible to prevent unstable vapor of a film forming material from being deposited on a substrate which is a film forming object. In the same manner, by bringing the shutter member into a closed state also at the time of not forming a film, it is possible to prevent unstable vapor of a film forming material from being deposited on a substrate which is a film forming object.

Further, by bringing the shutter member into an open state at the time of forming a film, vapor of a film forming material can be deposited on a substrate without being impeded by the shutter member.

In one preferred aspect of the present invention, at least one item out of the following items (1) to (5) differs depending on discharge system.

(1) substantial open area of each discharge opening
(2) substantial total open area of discharge openings
(3) distribution of discharge openings
(4) the number of discharge openings
(5) flow passage resistance of discharge system According to this aspect, a thickness and the distribution of a formed film on a substrate can be adjusted by the discharge system.

According to another aspect of the present invention relating to a method which overcomes substantially the same drawbacks, there is provided a method of manufacturing an organic EL device which performs a plurality of deposition steps in which a plurality of film forming layers are vacuum-deposited to a substrate in a single film forming chamber, wherein the vacuum deposition device which performs the vapor deposition is a vacuum deposition device which includes a plurality of evaporating parts for evaporating a film forming material, one discharge system is formed by connecting one set of evaporating part group which is constituted of one or a plurality of evaporating parts and one set of opening group which is constituted of a plurality of discharge openings, a flow passage where the plurality of discharge systems exist is provided, a main open-close valve is provided for every evaporating part, vapor generated in the evaporating part is introduced into the film forming material discharge part by opening the main open-close valve, and the vapor of the film forming material is discharged to the substrate from the film forming material discharge part, thus forming a film on the substrate, wherein the plurality of deposition steps are performed such that open areas of the discharge openings differ depending on discharge system, and the individual film forming materials having substantially the similar target discharge quantities of vapor per unit time are charged into the evaporation part belonging to the evaporation part group, and the film forming materials are evaporated in the evaporation parts and are formed on the substrate as films.

According to another aspect of the present invention, there is provided a method of manufacturing an organic EL device where an organic EL device including a plurality of co-deposition organic layers is manufactured by performing the co-deposition step for forming the co-deposition organic layers by simultaneously discharging a main film forming material and a sub film forming material using the vacuum deposition device a plurality of times, wherein a plurality of kinds of main film forming materials are selectively charged into evaporating parts which belong to the same evaporating part group, a plurality of kinds of sub film forming materials are selectively charged into evaporating parts which belong to another evaporating part group, and the co-deposition organic layers are formed as films on a substrate by evaporating the respective film forming materials in the evaporating parts.

In this aspect, the co-deposition is performed using the above-mentioned vacuum deposition device. As has been known, the co-deposition is a step of forming films by simultaneously discharging a plurality of film forming materials (main film forming material and sub film forming material). In this case, a deposition amount of the main film forming material and a deposition amount of the sub film forming material differ from each other considerably. To be more specific, in the co-deposition layers, in general, one material (for example, main film forming material) is contained by 70 to 99 weight %, and the other material (for example, sub film forming material) is contained by remaining 1 to 30 weight %. Accordingly, optimum conditions for discharge openings naturally differ from each other.

In this aspect, a plurality of kinds of main film forming materials are selectively charged into evaporating parts which belong to the same evaporating part group, a plurality kinds of sub film forming materials are selectively charged into evaporating parts which belong to another evaporating part group, and the co-deposition organic layers are formed as films on a substrate by evaporating the respective film forming materials in the evaporating parts. Accordingly, the main film forming material and the sub film forming material can be discharged under desired conditions.

In one preferred aspect of the present invention, in the co-deposition step, a main film forming material is evaporated in a single evaporating part belonging to a single discharge system, and vapor of the main film forming material is discharged through the discharge openings belonging to the discharge system, while the sub film forming material is evaporated in a single evaporating part belonging to a single discharge system which differs from the discharge system, and vapor of the sub film forming material is discharged through the discharge openings belonging to the discharge system Here, a sub film forming material is a concept which includes a material for forming a light emitting layer besides a dopant material such as a p-type dopant or n-type dopant. That is, the sub film forming material is a component which is contained in a layer formed as a film and whose content is smaller than the content of a main film forming material.

According to this aspect, the main film forming material and the sub film forming material can be discharged under desired conditions.

In one preferred aspect of the present invention, the vacuum deposition device includes: a large capacity discharge system where a total area of discharge openings in an opening group to which the discharge openings belong is large; and a small capacity discharge system where a total area of discharge openings in an opening group to which the discharge openings belong is smaller than the total area of discharge openings of the large capacity discharge system, the main film forming material is a component contained in a large amount in the layer formed as a film, the sub film forming material is a content contained in a smaller amount than the main film forming material in the layer formed as a film, the main film forming material is selectively charged into the evaporating part belonging to the large capacity discharge system, and the sub film forming material is selectively charged into the evaporating part belonging to the small capacity discharge system.

In this aspect, the main film forming material is discharged via the large capacity discharge system, and the sub film forming material is discharged via the small capacity discharge system and hence, the main film forming material and the sub film forming material can be discharged under desired conditions.

In one preferred aspect of the present invention, the vacuum deposition device is configured such that a film thickness sensor and a checking discharge opening for checking a film thickness are disposed in the inside of the film forming chamber, and a manifold portion and the checking discharge opening for checking a film thickness are communicated with each other, a co-deposition step for forming a co-deposition organic layer is performed by discharging a main film forming material through the discharge openings belonging to one or more discharge systems and, simultaneously, by discharging a sub film forming material through the discharge openings belonging to one or more other discharge systems, and a state where a film is formed by using only the main film forming material and/or a state where a film is formed by using only the sub film forming material is detectable at the time of performing the co-deposition step.

According to this aspect, in performing the co-deposition, a discharge amount of a main film forming material and a discharge amount of a sub film forming material can be individually confirmed. That is, a deposition speed of a single film forming material (main film forming material or sub film forming material) can be measured using the film thickness sensor belonging to one manifold portion and hence, the deposition can be performed while the composition of the co-deposition organic layer is accurately measured.

In one preferred aspect of the present invention, the organic EL device is configured such that a functional layer is interposed between two electrode layers, the functional layer includes a plurality of light emitting layers in each of which a host material which is the main film forming material is doped with a fluorescent material or a phosphorescent material which is the sub film forming material, and at least two light emitting layers are formed as a film in the inside of the film forming chamber.

According to this aspect, it is possible to easily manufacture an organic EL device provided with a plurality of light emitting layers.

Effect of the Invention

According to the vacuum deposition device and the method of manufacturing the organic EL device of the present invention, a discharge amount of film forming vapor appropriate for forming a uniform film can be discharged. Accordingly, a thickness of the film becomes uniform.

BRIEF DESCRIPTION OF THE DRAWINGS

FIG. 12A and FIG. 12B are plan views showing the relationship between the film forming material discharge part and the shutter member adopted by the vacuum deposition device shown in FIG. 1, wherein FIG. 12A shows a state where all discharge openings are in an open state which is a state at the time of forming a film, and FIG. 12B shows a state where all discharge openings are closed which is a state in a preparation stage.

MODES FOR CARRYING OUT THE INVENTION

Hereinafter, a vacuum deposition device according to a first embodiment of the present invention is described in detail by reference to drawings.

Figure 1:
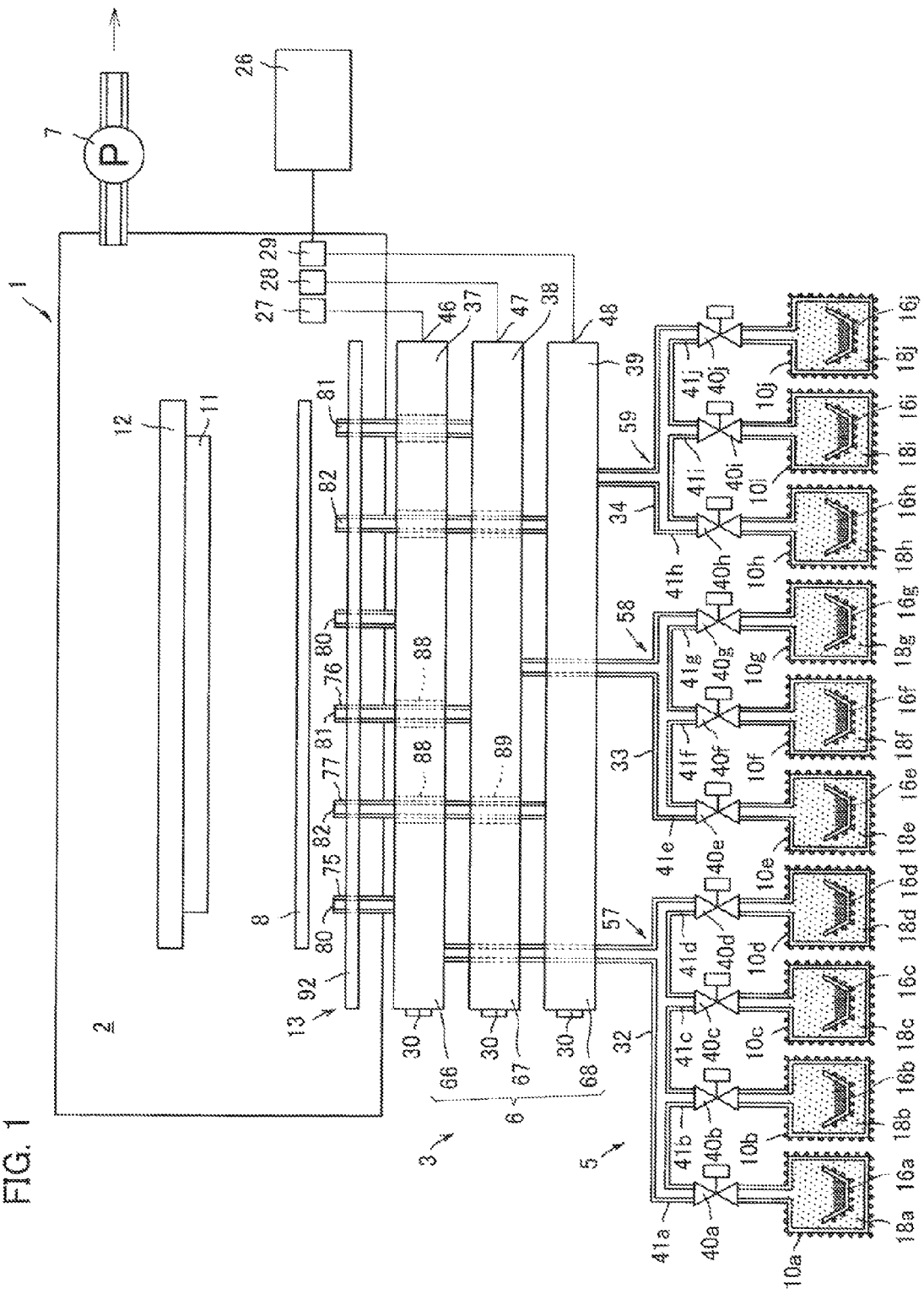
FIG. 1 is a constitutional view showing a vacuum deposition device according to an embodiment of the present invention.

The vacuum deposition device 1 according to the first embodiment of the present invention includes, as shown in FIG. 1, a film forming chamber 2, and a series of discharge circuits 3 which evaporate film forming materials and discharge the evaporated film forming materials to a substrate.

The film forming chamber 2 has air tightness and includes a pressure reducing unit 7. The pressure reducing unit 7 is equipment for maintaining a space in the inside of the film forming chamber 2 in a vacuum state, and is a known pressure reducing pump.

In this specification, "vacuum state" means a state having the degree of vacuum of not more than $10^{-3}$ (−three powers of 10) Pa. The higher the degree of vacuum, that is, the smaller the degree of vacuum expressed in terms of pressure, the more preferable vacuum state is acquired.

In the present embodiment, the specific degree of vacuum falls within a range from $1\times10^{-3}$ (−three powers of 10) to $1\times10^{-9}$ (−nine powers of 10) Pa. In view of preventing the intrusion of impurity such as dust, it is desirable that the degree of vacuum falls within a range from $1\times10^{-5}$ (−five powers of 10) to $1\times10^{-9}$ (−nine powers of 10) Pa.

In the case where the degree of vacuum is set lower than $1\times10^{-9}$ (−nine powers of 10) Pa, it may take an excessively long time until such degree of vacuum is acquired.

As shown in FIG. 1, the film forming chamber 2 includes a substrate conveyance device 12 for conveying a substrate 11 (base member), and a conveying-in opening and a conveying-out opening not shown in the drawing are formed in a wall surface of the film forming chamber 2.

The substrate conveyance device 12 is a device for conveying the substrate 11 (base member), and has a function of conveying the substrate 11 into the film forming chamber 2 and conveying out the substrate 11 from the film forming chamber 2, and has a function of fixing the substrate 11 at a desired film forming position. That is, the substrate conveyance device 12 can convey the substrate 11 to a predetermined film forming position, conveys the substrate 11 into the inside of the film forming chamber 2 from the outside of the film forming chamber 2 through the conveying-in opening, and can convey the substrate 11 to the outside of the film forming chamber 2 from the inside of the film forming chamber 2 through the conveying-out opening.

In the present embodiment, film thickness sensors 27, 28, 29 are disposed in the inside of the film forming chamber 2.

As shown in FIG. 1, the discharge circuit 3 includes: evaporating parts 10a to 10j; a manifold group 6; a film forming material discharge part 13; and a shutter member 8.

Although the shutter member 8 is disposed at a position close to the film forming material discharge part 13 in an actual vacuum deposition device, in FIG. 1, the shutter member 8 is shown away from the film forming material discharge part 13 from a viewpoint of facilitating the preparation of drawings.

Figure 2:
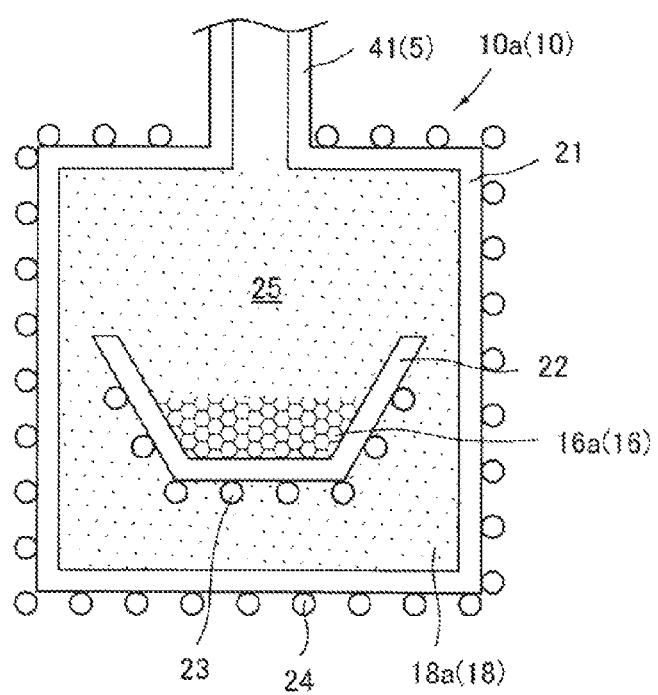
FIG. 2 is a conceptual view of an evaporating part of the vacuum deposition device shown in FIG. 1.
Figure 3:
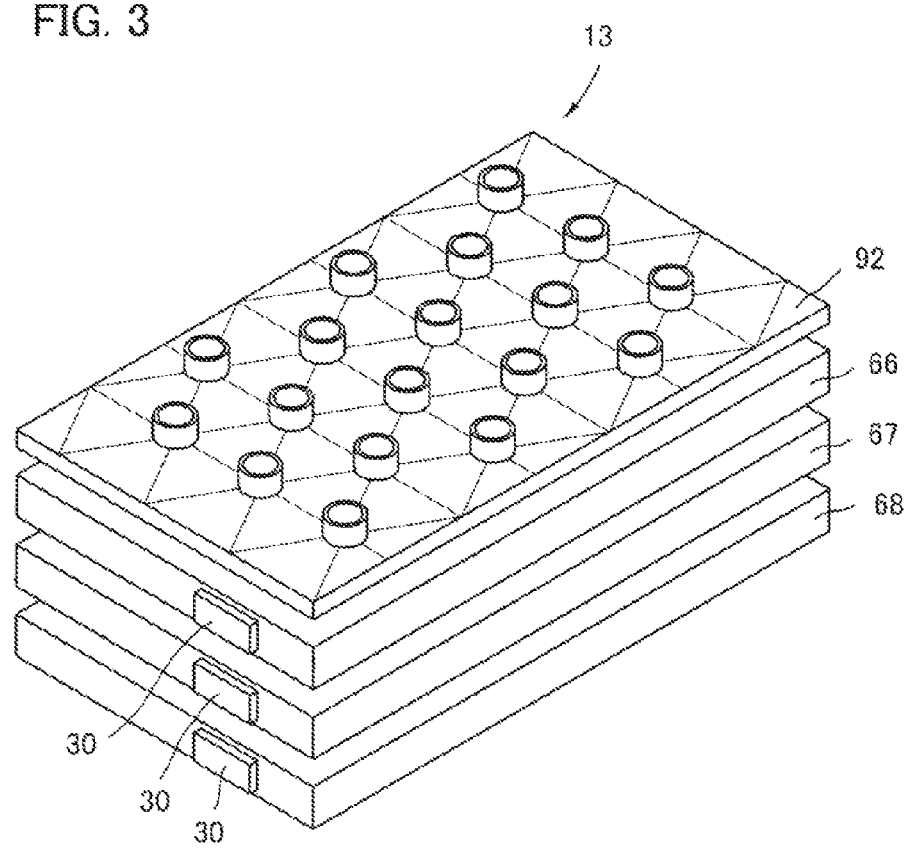
FIG. 3 is a perspective view conceptually expressing manifold portions and a film forming material discharge part of the vacuum deposition device shown in FIG. 1.
Figure 4:
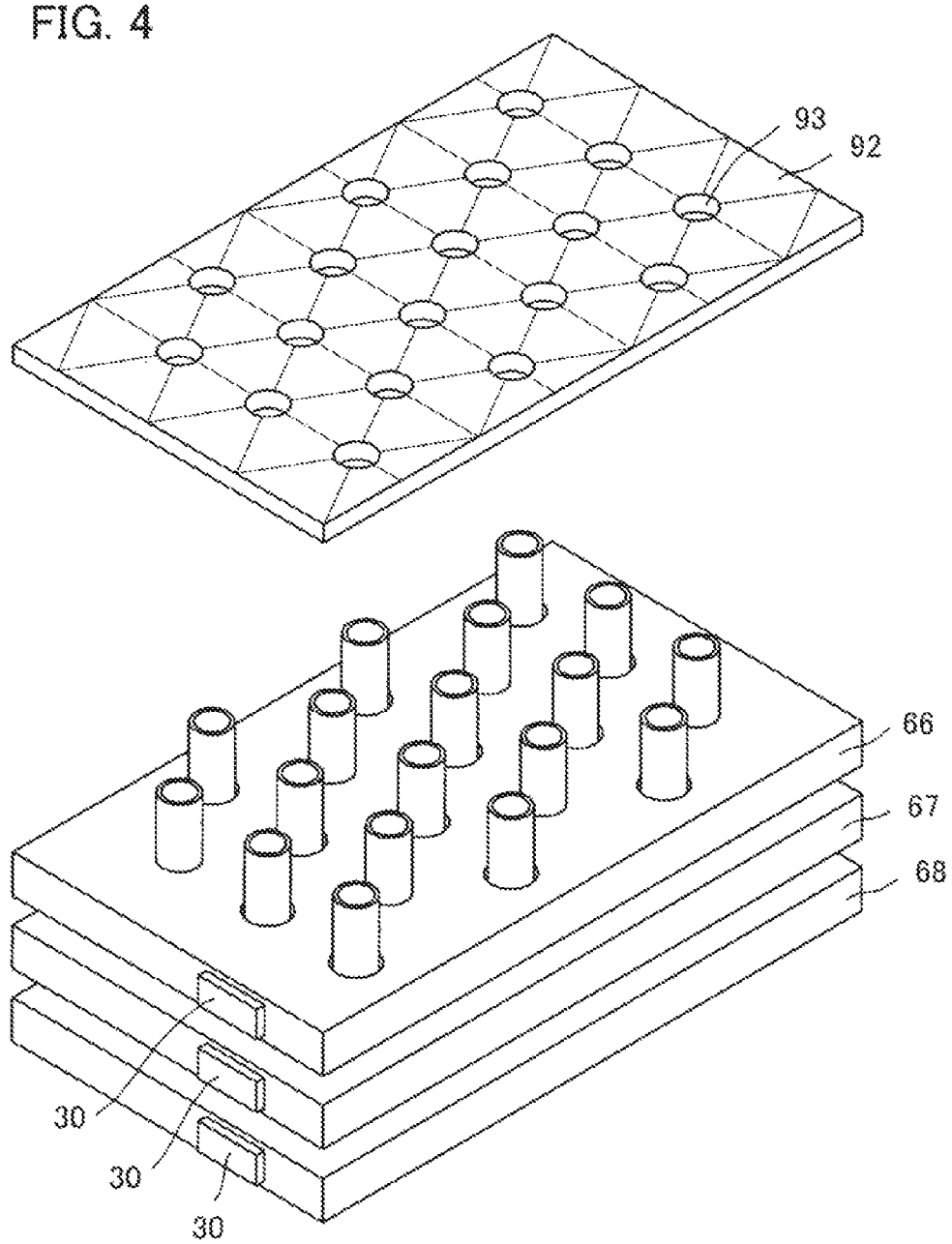
FIG. 4 is a perspective view conceptually expressing the manifold portions and the film forming material discharge part in the same manner as FIG. 3 and showing a state where a plate body which constitutes a part of the film forming material discharge part is removed.

As shown in FIG. 2, the evaporating part 10a (evaporating part 10b to 10j) is a device for evaporating a film forming material 16a (film forming materials 16b to 16j). The evaporating part 10a (evaporating part 10b to 10j) includes: an evaporation chamber 21; a crucible 22; and heating units 23, 24.

In the evaporation chamber 21, an evaporation space 25 is formed where a film forming material 16a (film forming materials 16b to 16j) in a solid state or in a liquid state is converted into film forming vapor 18a (18b to 18j) in a gaseous state.

In the description made hereinafter, to distinguish a property of the film forming materials 16a to 16j, the film forming material 16 (16a to 16j) which is formed into vapor is referred to as film forming vapor 18 (18a to 18j).

The crucible 22 is a vessel which stores a desired film forming material 16 therein.

The heating unit 23 is a member for heating the crucible 22, and the heating unit 24 is a member for heating the evaporation chamber 21 as a whole. Both heating units 23, 24 are formed of a known heater.

That is, the heating unit 23 is disposed around the crucible 22. A film forming material 16a (16b to 16j) is heated by the heating units 23 so that the film forming material 16a (16b to 16j) can be vaporized or sublimated. The heating unit 24 is disposed around the evaporation chamber 21. With the use of the heating unit 24, the evaporation chamber 21 can be maintained at a temperature slightly higher than an evaporation temperature of the film forming material 16a (16b to 16j) at the time of forming a film.

The film forming materials 16 (16a to 16j) are desired raw materials for forming layers of an organic EL device 100 described later.

As a property of the film forming material 16, the film forming material 16 can take a solid form such as a powder form or a pellet form, a semi-fluid fluid form, or a liquid form. That is, the film forming material 16 may be a material in a liquid state, in a powder state or in a particle state. In the present embodiment, the film forming material 16 in a powder state is used.

Evaporating parts 10 are divided into a plurality of evaporator groups. In the vacuum deposition device 1 of the present embodiment, ten evaporating parts 10a to 10j are divided into three evaporating part groups. In the vacuum deposition device 1 of the present embodiment, four evaporating parts 10a to 10d belong to the first evaporating part group, three evaporating parts 10e to 10g belong to the second evaporating part group, and three evaporating parts 10h to 10j belong to the third evaporating part group.

Next, the manifold group 6 is described. In the present embodiment, as can be understood from FIG. 3, FIG. 4, FIG. 5 and FIG. 6, the manifold group 6 is constituted of three manifold portions 66, 67, 68. That is, the manifold group 6 is formed by laminating the three manifold portions 66, 67, 68 to each other in the height direction.

Figure 5:
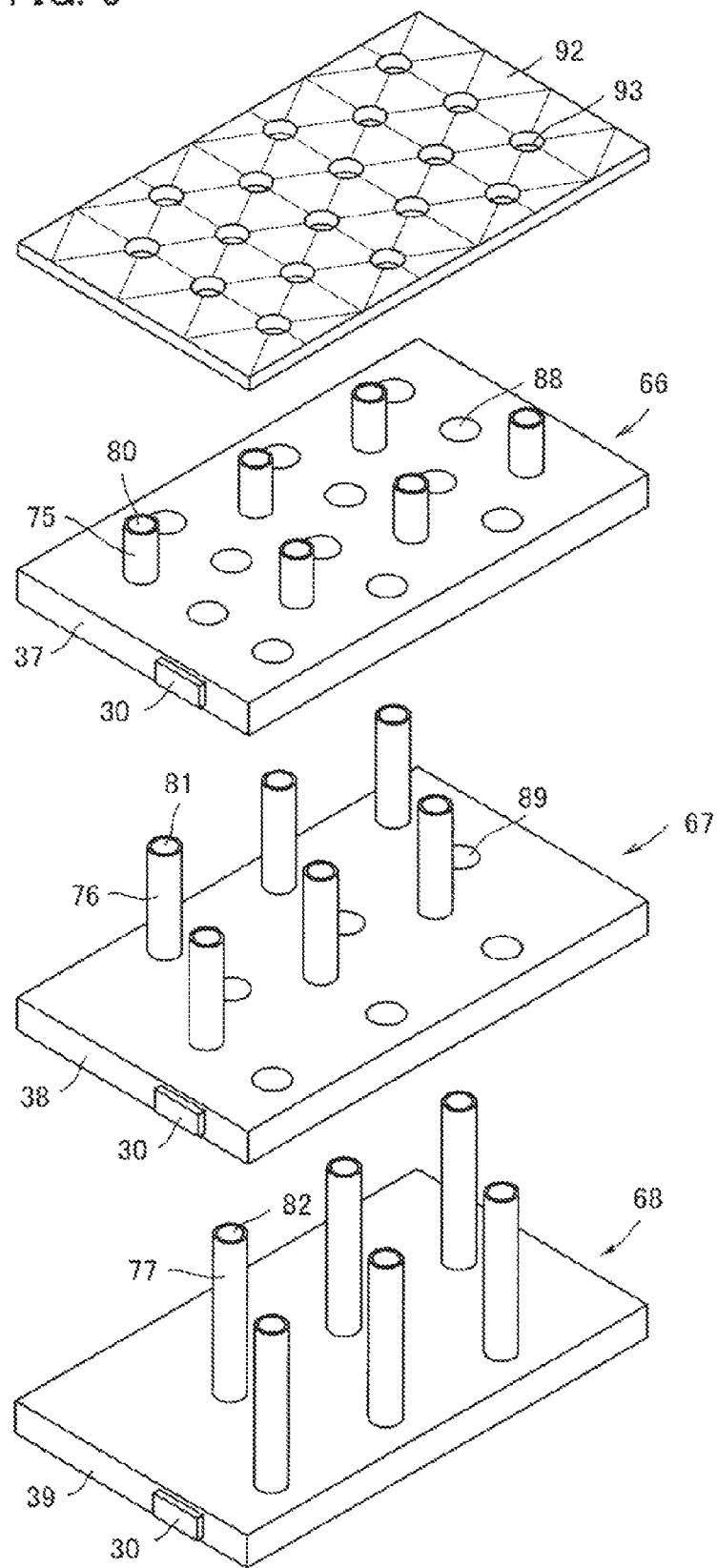
FIG. 5 is a perspective view showing a state where the manifold portions and the plate body shown in FIG. 3 are separated from each other.

As shown in FIG. 5, all manifold portions 66, 67, 68 which constitute the manifold group 6 have plate-shaped body portions 37, 38, 39 having an approximately rectangular outer profile respectively.

Figure 6:
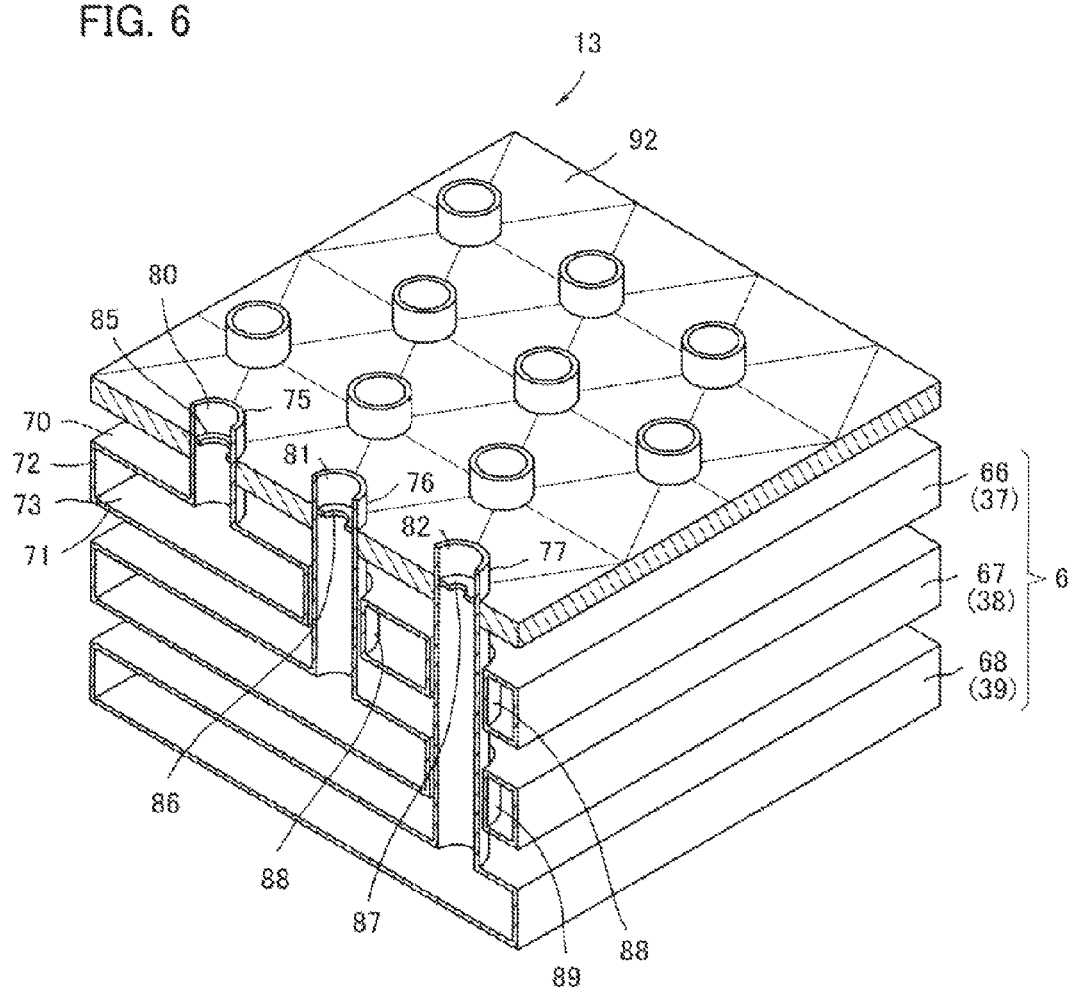
FIG. 6 is a cross-sectional perspective view of the manifold portions and the film forming material discharge part shown in FIG. 3.

As shown in FIG. 6, the inside of each body portion 37, 38, 39 is hollow. That is, as shown in FIG. 6, each manifold portion 66, 67, 68 includes: an upper plate 70; a lower plate 71; and a peripheral wall 72 which connects the upper plate 70 and the lower plate 71 to each other, and has a hollow portion 73 in the inside thereof. A large number of extension pipes 75, 76, 77 are formed on an upper surface (upper plate 70) of each manifold portion 66, 67, 68. From a viewpoint of facilitating the preparation of drawings, the number of extension pipes illustrated in the drawing is set considerably smaller than the number of extension pipes used in an actual device.

As shown in FIG. 5, lengths of the extension pipes 75, 76, 77 differ from each other corresponding to the manifold portions 66, 67, 68.

That is, all extension pipes 75 formed on the manifold portion 66 (hereinafter upper manifold portion) constituting an uppermost portion of the manifold group 6 are each shorter in length than the extension pipes 76, 77 formed on other manifold portions 67, 68.

The extension pipes 76 formed on the manifold portion 67 (hereinafter intermediate manifold portion) disposed below the manifold portion 66 has an intermediate length.

The extension pipes 77 formed on the manifold portion 68 (hereinafter lower manifold portion) which is disposed at a lowermost portion of the manifold group 6 is the longest in length compared to the extension pipes 75, 76 formed on other manifold portions 66, 67.

The manifold portions 66, 67, 68 each open upwardly through the above-mentioned extension pipes 75, 76, 77. Openings of the extension pipes 75, 76, 77 function as discharge openings 80, 81, 82. The discharge openings 80, 81, 82 belonging to the manifold portions 66, 67, 68 constitute one opening group respectively.

That is, all discharge openings 80 formed in association with the upper manifold portion 66 belong to the first opening group, all discharge openings 81 formed in association with the intermediate manifold portion 67 belong to the second opening group, and all discharge openings 82 formed in association with the lower manifold portion 68 belong to the third opening group.

Figure 7:
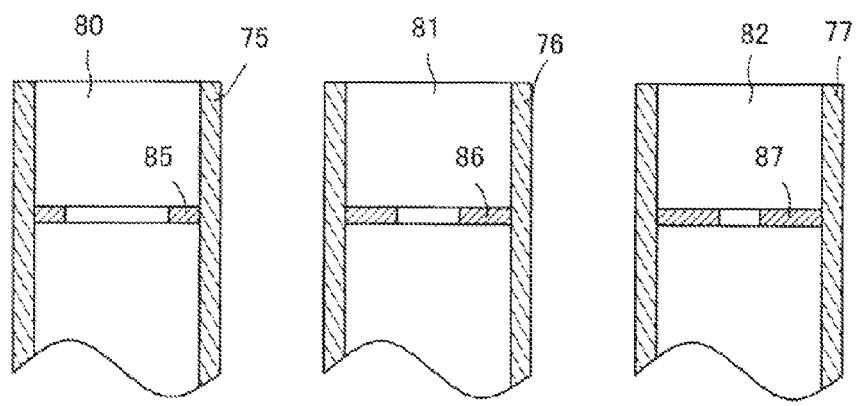
FIG. 7 is a cross-sectional view showing flow restrictions mounted in respective discharge opening of the vacuum deposition device shown in FIG. 1.

As shown in FIG. 6 and FIG. 7, flow restrictions 85, 86, 87 are mounted in the vicinity of open ends of the extension pipes 75, 76, 77 respectively. Open areas of the flow restrictions 85, 86, 87 differ from each other for respective manifold portions 66, 67, 68.

To be more specific, the flow restriction 85 mounted in the discharge opening 80 belonging to the first opening group, the flow restriction 86 mounted in the discharge opening 81 belonging to the second opening group, and the flow restriction 87 mounted in the discharge opening 82 belonging to the third opening group have different opening diameters.

That is, as shown in FIG. 7, the flow restriction 85 mounted in the discharge opening 80 belonging to the first opening group has a large open area. The flow restriction 86 mounted in the discharge opening 81 belonging to the second opening group has an intermediate open area. The flow restriction 87 mounted in the discharge opening 82 belonging to the third opening group has a small open area.

In the present embodiment, the flow restrictions 85, 86, 87 mounted in the discharge openings 80, 81, 82 belonging to each opening group have the same opening diameter and the same open area.

That is, the opening of all flow restrictions 85 mounted in the discharge opening 80 belonging to the first opening group is 0.48 square centimeters, for example. The opening of all flow restrictions 86 mounted in the discharge opening 81 belonging to the second opening group is 0.12 square centimeters. The opening of all flow restrictions 87 mounted in the discharge opening 82 belonging to the third opening group is 0.03 square centimeters.

The largest discharge opening 80 is 16 times as large as the smallest discharge opening 82 using the smallest discharge opening 82 as the reference. It is desirable that the magnification between the largest discharge opening 80 and the smallest discharge opening 82 falls within a range of 2 or more times and 30 or less times. As in the case of the present embodiment, when the discharge openings 80, 81, 82 are made different from each other in three stages, it is appropriate that the magnification between the discharge openings 80, 81 and the magnification between the discharge openings 81, 82 fall within a range of approximately 2 to 6 times.

A total area of the discharge openings belonging to each one opening group differ from a total area of the discharge openings belonging to other groups.

Figure 8:
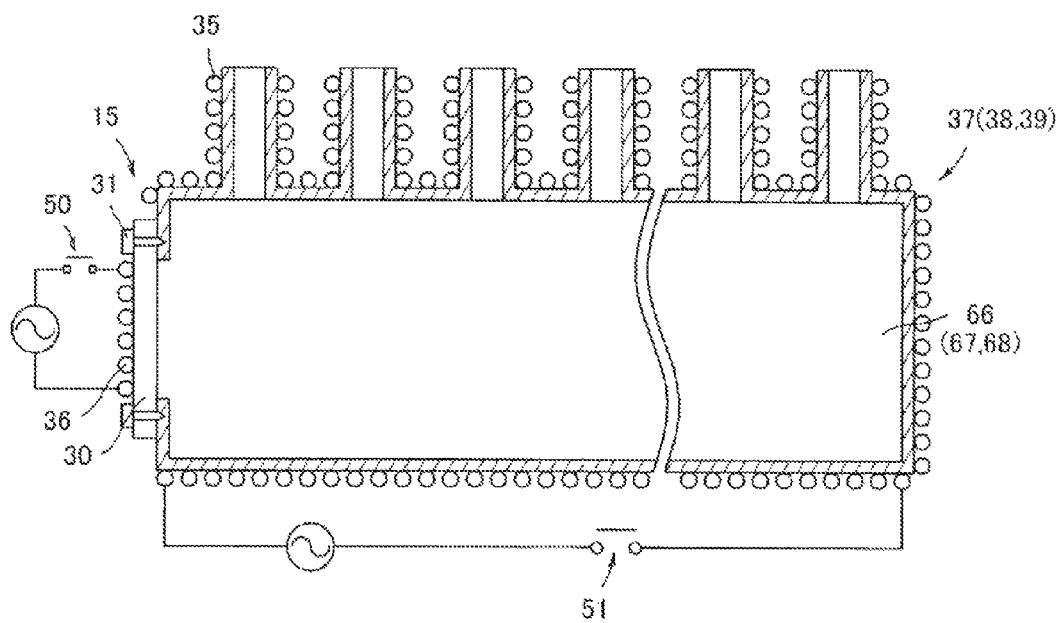
FIG. 8 is a cross-sectional view of the manifold portion shown in FIG. 1.

As shown in FIG. 8, a residual vapor removing unit 15 is provided to the body portions 37, 38, 39 of the respective manifold portions 66, 67, 68. To be more specific, the residual vapor removing unit 15 is constituted of a hatch 30 for cleaning a body portion and a heating unit 36 described later.

As shown in FIG. 8, the hatch 30 is joined to another portion of the body portion using screws 31. The hatch 30 can be separated from another of the body portion by removing the screws 31.

In this embodiment, the heating units 35, 36 are provided on the whole surface of each manifold portion 66, 67, 68. That is, the heating unit 35 is provided to portions of the body portions 37, 38, 39 of each manifold portion 66, 67, 68 except for the hatch 30 and to the extension pipes 75, 76, 77. Another heating unit 36 is provided to the hatch 30.

Both heating units 35, 36 are formed of a known heater.

In the present embodiment, the heating units 35, 36 are provided to the whole surface of each manifold portion 66, 67, 68. Accordingly, at the time of forming a film, each manifold portion 66, 67, 68 can be maintained at a temperature slightly higher than an evaporation temperature of the film forming material 16a (16b to 16j).

In the present embodiment, the heating unit 36 provided to the hatch 30 is independent from the heating unit 35 provided to other portions of each manifold portion 66, 67, 68. As shown in FIG. 8, the heating unit 36 provided to the hatch 30 is turned on/off by a relay 50, and the heating unit 35 provided to other portions of each manifold portion 66, 67, 68 is turned on/off by a relay 51. Due to such a constitution, only the heating unit 36 provided to the hatch 30 can be stopped independently.

As shown in FIG. 6, among the three manifold portions 66, 67, 68, tunnel pipes 88, 89 are formed in the upper manifold portion 66 and the intermediate manifold portion 67 disposed below the upper manifold portion 66, respectively. Each tunnel pipe 88, 89 is provided for connecting the upper plate 70 and the lower plate 71 of each manifold portion 66, 67 in a tunnel shape. The tunnel pipes 88, 89 are not communicably connected to the hollow portions 73 formed in the manifold portions 66, 67.

A tunnel pipe is not formed in the lower manifold portion 68.

As can be understood from FIG. 5 and FIG. 6, the number of tunnel pipes 88 formed in the upper manifold portion 66 is larger than the number of tunnels 89 formed in the intermediate manifold portion 67. That is, in the upper manifold portion 66, the tunnel pipes 88 are formed on or above the tunnel pipes 89 formed in the intermediate manifold portion 67 and, further, the tunnel pipes 88 are also formed on or above the extension pipes 76 formed on the intermediate manifold portion 67.

As described above, the three manifold portions 66, 67, 68 are laminated to each other in the height direction.

The extension pipes 75 provided to the upper manifold portion 66 project upwardly.

The extension pipes 76 provided to the intermediate manifold portion 67 pass through the tunnel pipes 88 formed in the upper manifold portion 66, and project upwardly from the upper manifold portion 66.

The extension pipes 77 provided to the lower manifold portion 68 pass through the tunnel pipes 89 formed in the intermediate manifold portion 67 and the tunnel pipes 88 formed in the upper manifold portion 66, and project upwardly from the upper manifold portion 66.

Accordingly, all discharge openings 80, 81, 82 formed in association with the manifold portions 66, 67, 68 respectively are disposed above the manifold group 6. Further, all discharge openings 80, 81, 82 (positions of distal end surfaces of the extension pipes 75, 76, 77) have the same height.

As shown in FIG. 6, the film forming material discharge part 13 is constituted of: distal end portions of the extension pipes 75, 76, 77 of the above-mentioned manifold group 6; and a plate body 92 which fixes the distal end portions. In the film forming material discharge part 13, the discharge openings 80, 81, 82 which are communicably connected with the manifold portions 66, 67, 68, respectively are distributed on an upper surface of the plate body 92 with a planar expansion.

Figure 9:
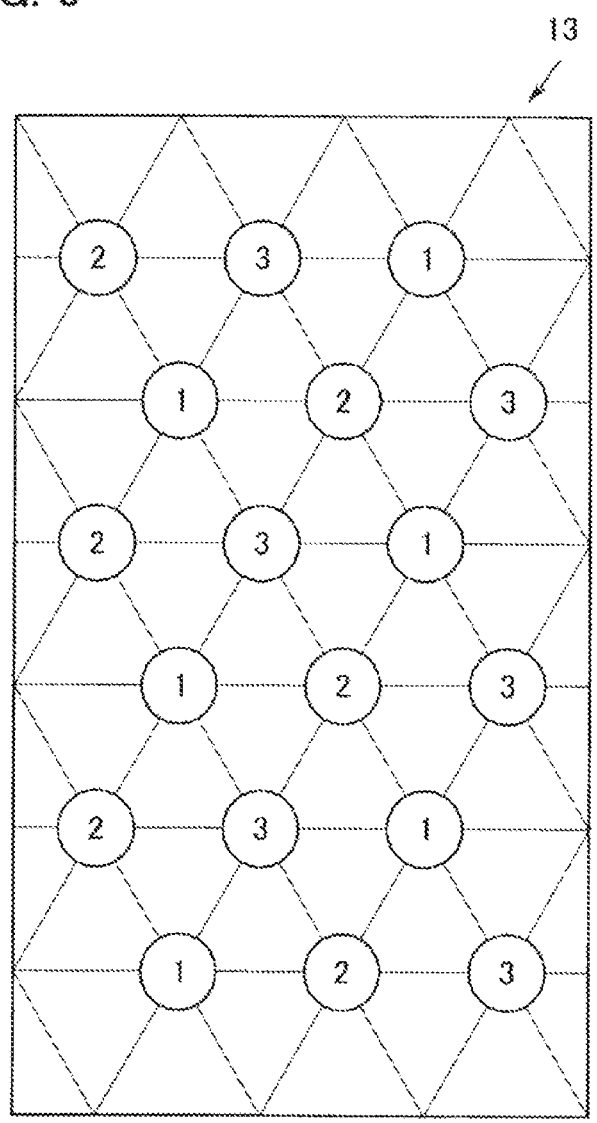
FIG. 9 is a plan view conceptually expressing the film forming material discharge part adopted by the vacuum deposition device shown in FIG. 1.

The layout of the discharge openings 80, 81, 82 which project from the film forming material discharge part 13 is shown in FIG. 9. That is, a pattern obtained by connecting the discharge openings 80, 81, 82 disposed adjacent to each other forms a shape where regular triangles are densely arranged. In FIG. 9, numerals 1, 2, 3 indicate the opening groups to which the discharge openings 80, 81, 82 belong, respectively.

That is, the openings to which numeral 1 is given are the discharge openings 80 belonging to the first group. The openings to which numeral 2 is given are the discharge openings 81 belonging to the second group. The openings to which numeral 3 is given are the discharge openings 82 belonging to the third group.

Accordingly, the flow restriction 85 having a large open area is mounted in the discharge openings 80 to which numeral 1 is given. The flow restriction 86 having an intermediate open area is mounted in the discharge openings 81 to which numeral 2 is given. The flow restriction 87 having a small open area is mounted in the discharge openings 82 to which numeral 3 is given.

Figure 10:
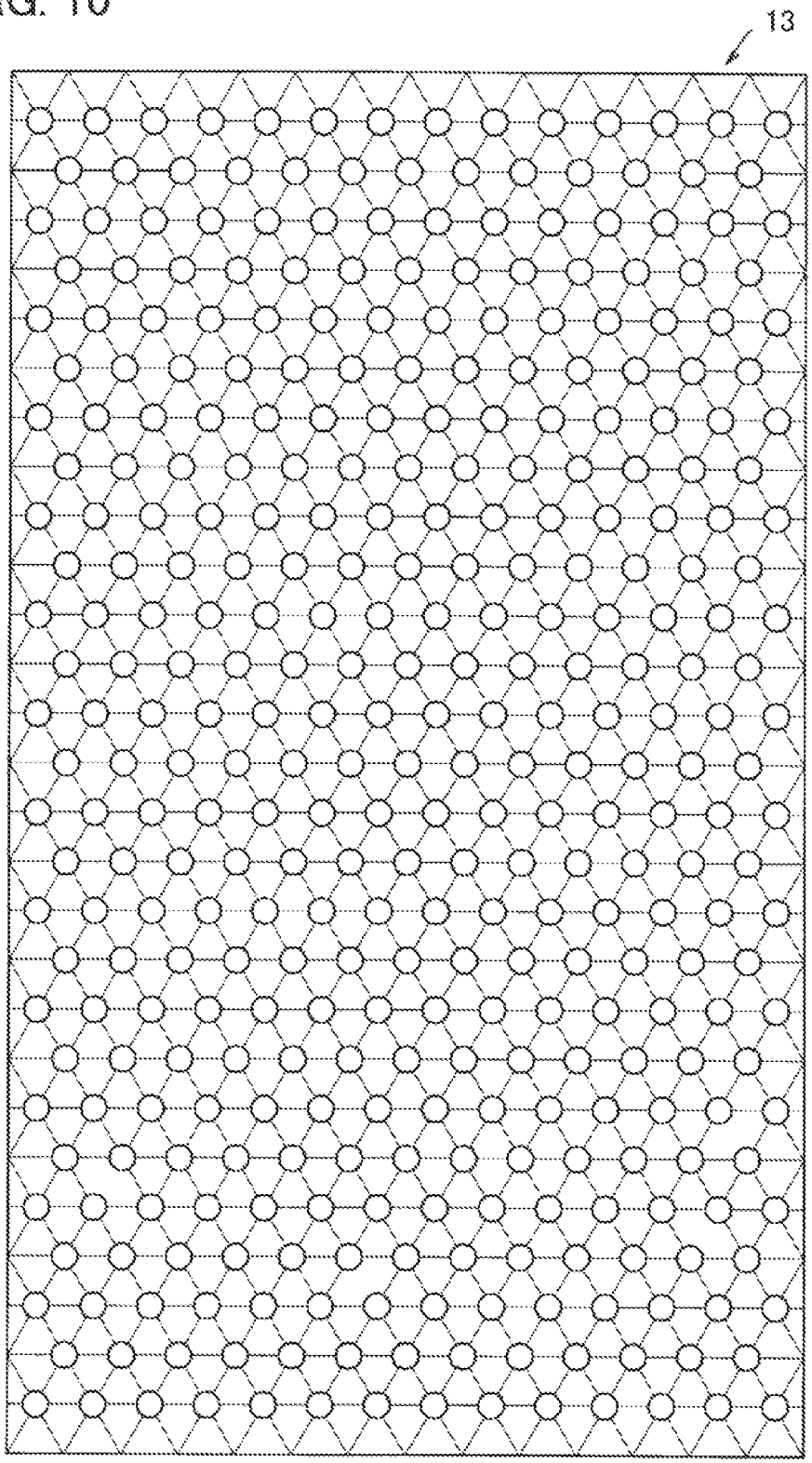
FIG. 10 is a plan view of a film forming material discharge part adopted by the vacuum deposition device shown in FIG. 1.

Although the total number of discharge openings 80, 81, 82 shown in FIG. 9 is 18 from a viewpoint of facilitating the preparation of drawings, as shown in FIG. 10, the total number of discharge openings 80, 81, 82 is considerably large in an actual vacuum deposition device. That is, the large number of discharge openings 80, 81, 82 is distributed in the film forming material discharge part 13 with a planar expansion.

This tendency with respect to the number of discharge openings 80, 81, 82 is also observed with respect to the number of extension pipes 75, 76, 77.

In the present embodiment, around each discharge opening 80, 81, 82 belonging to one opening group, the discharge openings 80, 81, 82 belonging to the opening groups different from one opening group are always disposed.

For example, as shown in FIG. 9, all discharge openings which are disposed adjacent to each discharge opening 80 belonging to the first opening group are the discharge openings 81 belonging to the second opening group or the discharge openings 82 belonging to the third opening group.

All discharge openings which are disposed adjacent to each discharge opening 81 belonging to the second opening group are the discharge openings 80 belonging to the first opening group or the discharge openings 82 belonging to the third opening group.

All discharge openings which are disposed adjacent to each discharge opening 82 belonging to the third opening group are the discharge openings 80 belonging to the first opening group or the discharge openings 81 belonging to the second opening group.

Figure 11:
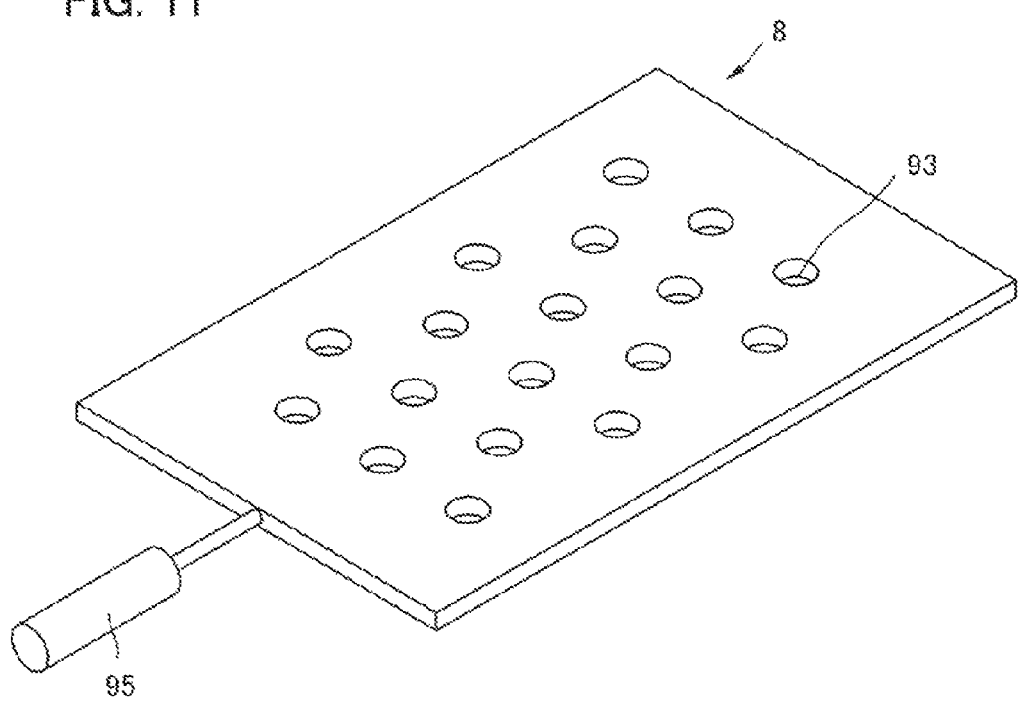
FIG. 11 is a perspective view of a shutter member adopted by the vacuum deposition device shown in FIG. 1.

As can be understood from FIG. 1 and FIG. 11, the shutter member 8 is a plate body where openings 93 are formed at positions corresponding to the above-mentioned respective discharge openings 80, 81, 82. The shutter member 8 is moved in the horizontal direction by a power source such as a pneumatic cylinder 95. That is, the shutter member 8 is movable relative to the respective discharge openings 80, 81, 82.

Figure 12A:
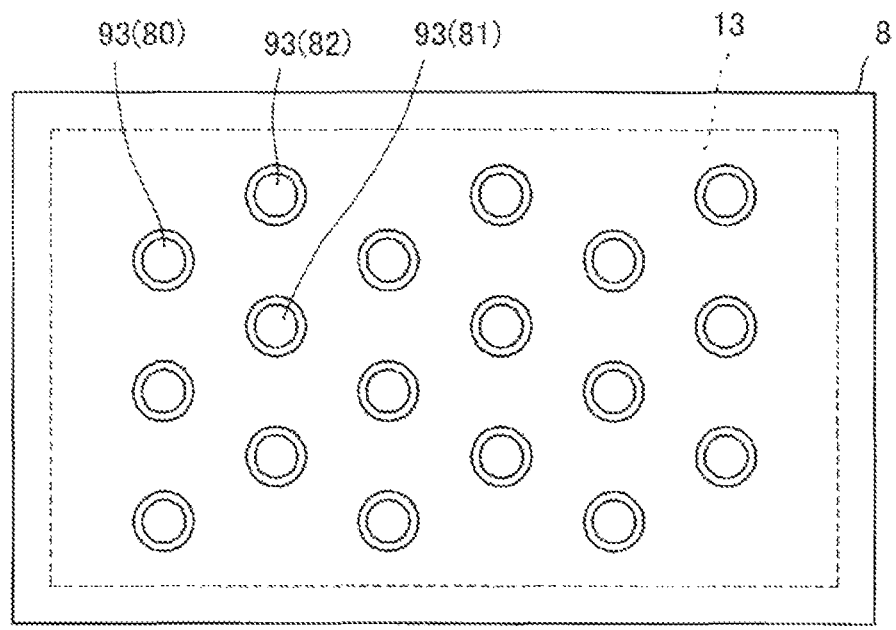

As shown in FIG. 12A, the shutter member 8 has an area sufficient for substantially covering a whole surface of the film forming material discharge part 13.

Further, a heating unit not shown in the drawing is provided to the shutter member 8 so that, at the time of forming a film, the shutter member 8 is maintained at a temperature slightly higher than an evaporation temperature of the film forming material 16a (16b to 16j).

In this specification, "substantially covering a whole surface" means a state where the shutter member 8 covers a portion of 90% or more and 100% or less of a main surface of the film forming material discharge part 13.

Next, a connecting flow passage 5 which connects members of the discharge circuit 3 to each other is described.

As shown in FIG. 1, the connecting flow passage 5 includes: a first supply flow passage 32 through which film forming vapor 18a to 18d is supplied to the upper manifold portion 66; a second supply flow passage 33 through which film forming vapor 18e to 18g is supplied to the intermediate manifold portion 67; a third supply flow passage 34 through which film forming vapor 18h to 18j is supplied to the lower manifold portion; and branch flow passages 41a to 41j which are connected to the respective evaporating parts 10a to 10j.

Main open-close valves 40a to 40j are provided to intermediate portions of the branch flow passages 41a to 41j, respectively. In other words, the main open-close valves 40a to 40j are positioned in the branch flow passages 41a to 41j at middle portions of the flows of the film forming vapor 18a to 18j in the flowing direction. In this manner, the main open-close valves 40a to 40j are provided for the respective evaporating parts 10a to 10j in the present embodiment.

The main open-close valves 40a to 40j are formed of a known open-close valve, and are openable-closable in response to commands transmitted from a control device 26.

The vacuum deposition device 1 of the present embodiment includes three discharge systems.

That is, the vacuum deposition device 1 includes the first discharge system 57 where the evaporating parts 10a to 10d belonging to the first evaporating part group and the upper manifold portion 66 are connected to each other by way of the first supply flow passage 32, and the upper manifold portion 66 and the discharge openings 80 belonging to the first opening group which are formed in association with the upper manifold portion 66 are connected to each other. The flow restrictions 85 having a large open area are provided to the first discharge system 57 so that the first discharge system 57 has a small flow passage resistance.

The vacuum deposition device 1 includes the second discharge system 58 where the evaporating parts 10e to 10g belonging to the second evaporating part group and the intermediate manifold portion 67 are connected to each other by way of the second supply flow passage 33, and the intermediate manifold portion 67 and the discharge openings 81 belonging to the second opening group which are formed in association with the intermediate manifold portion 67 are connected to each other. The flow restrictions 86 having an approximately intermediate open area is provided to the second discharge system 58 so that the second discharge system 58 has an intermediate flow passage resistance.

The vacuum deposition device 1 also includes the third discharge system 59 where the evaporating parts 10h to 10j belonging to the third evaporating part group and the lower manifold portion 68 are connected to each other by way of the third supply flow passage 34, and the lower manifold portion 68 and the discharge openings 82 belonging to the third opening group which are formed in association with the lower manifold portion 68 are connected to each other. The flow restrictions 87 having a small open area are provided to the third discharge system 59 so that the third discharge system 59 has a large flow passage resistance.

In the present embodiment, the numbers of discharge openings 80, 81, 82 in the respective discharge systems 57, 58, 59 are equal to each other.

However, the flow restrictions 85, 86, 87 mounted in the respective discharge openings 80, 81, 82 have different open areas. Accordingly, the discharge systems 57, 58, 59 differ from each other in total open area of the flow restrictions 85, 86, 87.

To be more specific, the flow restrictions 85 having a large open area are provided to the first discharge system 57 so that the total open area of the flow restrictions 85 is the largest, and the substantial open area of the discharge openings 80 is the largest.

The flow restrictions 86 having an intermediate open area are provided to the second discharge system 58 so that the total open area of the flow restrictions 86 is intermediately large, and the substantial open area of the discharge openings 81 is intermediately large.

The flow restrictions 87 having a small open area are provided to the third discharge system 59 so that the total open area of the flow restrictions 87 is the smallest, and the substantial open area of the discharge openings 81 is the smallest.

A heating unit not shown in the drawing is mounted on the connecting flow passage 5 so that, at the time of forming a film, the connecting flow passage 5 is heated to a temperature equal to or above evaporation temperature of the film forming material 16. Accordingly, even when film forming vapor 18 in a gaseous form passes through the connecting flow passage 5, a state of the film forming vapor 18 is not changed and hence, the film forming vapor 18 can flow to each manifold portion 66, 67, 68 while maintaining a gaseous form. Due to such a constitution, it is possible to restrain a phenomenon that the film forming vapor 18a to 18j is solidified on an inner surface of a pipe which forms the connecting flow passage 5 therein so that the film forming material 16 fixedly adheres to the inner surface of the pipe.

As shown in FIG. 1, in the vacuum deposition device 1, a discharge opening 46 for checking a film thickness is connected to the upper manifold portion 66 so that vapor constituting a film forming material can be discharged to the film thickness sensor 27.

A discharge opening 47 for checking a film thickness is connected to the intermediate manifold portion 67 so that vapor constituting a film forming material can be discharged to the film thickness sensor 28.

Further, a discharge opening 48 is connected to the lower manifold portion 68 so that vapor constituting a film forming material can be discharged to the film thickness sensor 29.

The vacuum deposition device 1 is configured such that information read by the film thickness sensors 27, 28, 29 is transmitted to the control device 26.

The film thickness sensors 27, 28, 29 are formed of a known film thickness sensor, and can transmit information relating to a thickness of a film to be formed to the control device 26.

The control device 26 is a device which can control opening/closing of the main open-close valves 40a to 40j, and can transmit opening/closing commands to the main open-close valves 40a to 40j corresponding to information transmitted from the film thickness sensors 27, 28, 29.

Next, the positional relationship between the film forming chamber 2 and the discharge circuit 3 is described.

In the vacuum deposition device 1 of the present embodiment, the most part of the discharge circuit 3 is disposed outside the film forming chamber 2.

That is, in the vacuum deposition device 1 of the present embodiment, as shown in FIG. 1, all of the body portions 37, 38, 39 of the three manifold portions 66, 67, 68 are disposed outside the film forming chamber 2.

Only distal end sides of the extension pipes 75, 76, 77 which are formed in association with the respective manifold portions 66, 67, 68, and the film forming material discharge part 13 are disposed in the inside of the film forming chamber 2.

The plate body 92 of the film forming material discharge part 13 is disposed in a horizontal posture, and all discharge openings 80, 81, 82 are directed in the direction toward the substrate 11.

The film thickness sensors 27, 28, 29 are disposed in the inside of the film forming chamber 2, and are placed in the same vacuum environment as the substrate 11.

As shown in FIG. 1, the substrate conveyance device 12 is disposed at a position away from a discharge surface of the film forming material discharge part 13 in the discharging direction by a predetermined distance, and the shutter member 8 is disposed between the substrate conveyance device 12 and the discharge surface of the film forming material discharge part 13. To be more specific, the shutter member 8 is disposed between the substrate conveyance device 12 and the film forming material discharge part 13.

Figure 12B:
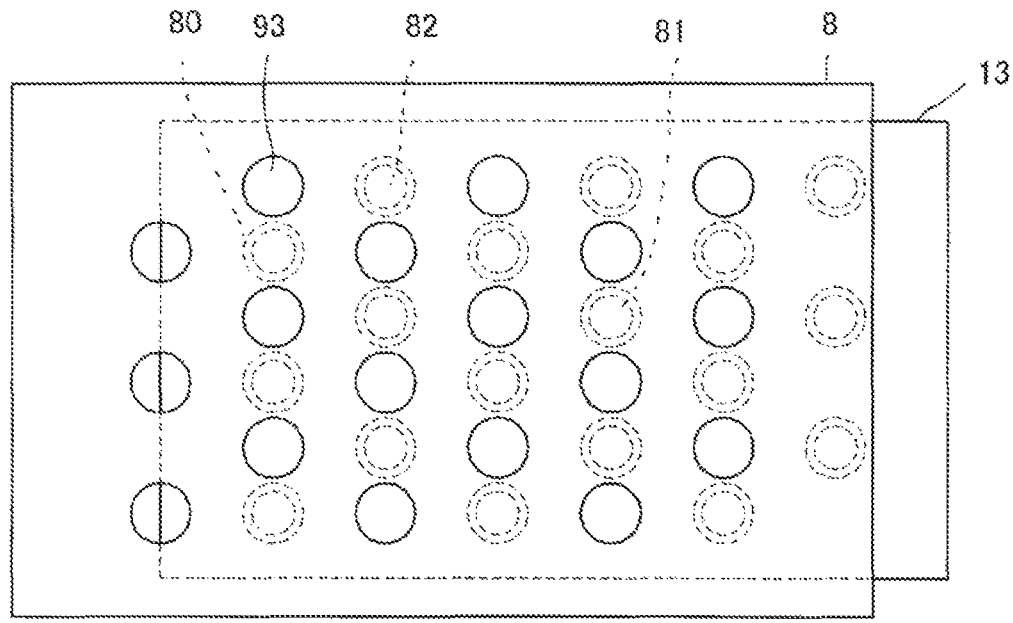

As described above, the shutter member 8 can be moved in the horizontal direction by the pneumatic cylinder 95 (see FIG. 11). Further, as described above, the shutter member 8 has an area sufficient for substantially covering the whole surface of the film forming material discharge part 13, and the openings 93 are formed in the shutter member 8 at positions corresponding to the discharge openings 80, 81, 82. Accordingly, when the openings 93 formed in the shutter member 8 are aligned with the discharge openings 80, 81, 82 formed in the film forming material discharge part 13 as shown in FIG. 12A, all discharge openings 80, 81, 82 formed in the film forming material discharge part 13 are brought into an open state. On the other hand, when the shutter member 8 is displaced by operating the pneumatic cylinder 95, as shown in FIG. 12B, the openings 93 formed in the shutter member 8 are displaced from the discharge openings 80, 81, 82 formed in the film forming material discharge part 13 so that all discharge openings 80, 81, 82 formed in the film forming material discharge part 13 are brought into a closed state.

Next, the description is made with respect to a method of forming films of the organic EL device 100 (see FIG. 18) which is performed using the vacuum deposition device 1 of the present invention. Prior to the description of film forming steps, the description is made with respect to a state of respective portions of the vacuum deposition device 1 at a point of time that the formation of a film is started.

Firstly, the state of the film forming chamber 2 is described. A pressure in the film forming chamber 2 is always being reduced by the pressure reducing unit 7 so that the film forming chamber 2 is always in an ultra-high vacuum state. Here, "ultra-high vacuum state" means a state where the degree of vacuum is $10^{-5}$ Pa or below.

In the vacuum deposition device 1 of the present embodiment, the most part of the manifold portions 66, 67, 68 is disposed outside the film forming chamber 2 and hence, a volume of the film forming chamber 2 is small whereby a time necessary for bringing an atmosphere in the film forming chamber 2 into the "ultra-high vacuum state" is relatively short.

All main open-close valves 40a to 40j are in a closed state. Desired film forming materials 16a to 16j are filled in the crucibles 22 of the respective evaporating parts 10a to 10j.

In the present embodiment, it is taken into account that, with respect to the film forming materials 16a to 16j filled in the crucibles 22, the film forming materials having similar required thicknesses are filled in the evaporating parts 10a to 10j belonging to the same group.

In the present embodiment shown in FIG. 1, the vacuum deposition device 1 includes the ten evaporating parts 10a to 10j so that, at maximum, ten kinds of film forming vapor 18a to 18j which differ from each other in composition can be discharged.

To discharge ten kinds of film forming vapor, ten kinds of film forming materials 16a to 16j are filled in the crucibles 22 in the evaporating parts 10a to 10j. In filling the materials in the crucibles 22, film thicknesses which the substrate 11 is required to have are studied. That is, ten kinds of film forming materials 16a to 16j are divided into groups, that is, a film forming material group where each film forming material is required to form a film having a large film thickness (hereinafter referred to as a thick film group), a film forming material group where each film forming material is required to form a film having an intermediate film thickness (hereinafter referred to as an intermediate thick film group), and a film forming material group where each film forming material is required to form a film having a small film thickness (hereinafter referred to as a thin film group).

Then, the film forming materials 16 belonging to the thick film group are charged into the evaporating parts 10a to 10d belonging to the first group. The film forming materials 16 belonging to the intermediate thick film group are charged into the evaporating parts 10e to 10g belonging to the second group. The film forming materials 16 belonging to the thin film group are charged into the evaporating parts 10h to 10j belonging to the third group.

Then, the film forming material 16a (16b to 16j) is heated using the heating unit 23 disposed around the crucible 22 so that the film forming material 16a (16b to 16j) is vaporized or sublimated. Further, the inside of the evaporation chamber 21 is maintained at a temperature slightly higher than an evaporation temperature of the film forming material 16a (16b to 16j) by the heating unit 24 disposed around the evaporation chamber 21 shown in FIG. 2.

The connecting flow passage 5 is also maintained at a temperature slightly higher than an evaporation temperature of the film forming material 16a (16b to 16j) by supplying electricity to a heating unit not shown in the drawing in the connecting flow passage 5. In the same manner, the hatch 30, portions of the body portion 37, 38, 39 other than the hatch 30 and the extension pipes 75, 76, 77 shown in FIG. 5 are heated by supplying electricity to the heating units 35, 36 (see FIG. 8) mounted on each manifold portion 66, 67, 68.

That is, the hatch 30 is maintained at a temperature slightly higher than an evaporation temperature of the film forming material 16a (16b to 16j) by the heating unit 36. Portions of the body portions 37, 38, 39 other than the hatch 30 and the extension pipes 75, 76, 77 are heated by the heating unit 36. Accordingly, each manifold portion 66, 67, 68 is, as a whole, maintained at a temperature slightly higher than an evaporation temperature of the film forming material 16a (16b to 16j).

In this manner, in the vacuum deposition device 1, flow passages which connect the discharge openings 80, 81, 82 and the evaporating parts 10 to each other and through which the film forming vapor 18 passes are heated by the heating units and hence, it is possible to prevent film forming vapor 18 from being solidified in the flow passage.

Next, the description is made with respect to a method of forming films of the organic EL device 100 (see FIG. 18) which is performed using the vacuum deposition device 1 of the present embodiment.

In manufacturing the organic EL device 100 using the vacuum deposition device 1, the substrate 11 is conveyed into the film forming chamber 2 from a preparatory chamber not shown in the drawing.

In the present embodiment, the preparatory chamber not shown in the drawing is brought into a vacuum state in advance, and the substrate 11 is conveyed into the film forming chamber 2 by opening the conveying-in opening (not shown in the drawing) of the film forming chamber 2 in such a vacuum state.

Here, although the description is made such that the preparatory chamber is in a vacuum state, a pressure in the preparatory chamber is not reduced to a level that the preparatory chamber is in "an ultra-high vacuum state". Accordingly, when the conveying-in opening (not shown in the drawing) of the film forming chamber 2 is opened, the degree of vacuum in the film forming chamber 2 is slightly reduced. That is, a pressure in the film forming chamber 2 is slightly increased.

However, the operation of the pressure reducing unit 7 is continued at least until the formation of films is started so that the degree of vacuum in the film forming chamber 2 is recovered to "an ultra-high vacuum state". Particularly, in the vacuum deposition device 1 of the present embodiment, the most part of the manifold portions 66, 67, 68 is disposed outside the film forming chamber 2 and hence, a volume of the film forming chamber 2 is relatively small whereby a long time is not required for recovering the reduced degree of vacuum to "an ultra-high vacuum state".

The substrate 11 conveyed into the film forming chamber 2 by the substrate conveyance device 12 is fixed such that the substrate 11 faces an injection surface of the film forming material discharge part 13 in an opposed manner.

A transparent conductive film or the like is formed on the substrate 11 to be conveyed in a different step in advance, and the substrate 11 in such a state is conveyed into the vacuum deposition device 1. As a method of forming the transparent conductive film on the substrate, a known method such as sputtering can be used.

By bringing the shutter member 8 into a closing posture as shown in FIG. 12B, all discharge openings 80, 81, 82 formed in the film forming material discharge part 13 are brought into a closed state. That is, by displacing the openings 93 formed in the shutter member 8 from the discharge openings 80, 81, 82 formed in the film forming material discharge part 13, all discharge openings 80, 81, 82 formed in the film forming material discharge part 13 are brought into a closed state.

Thereafter, any one of the main open-close valves 40a to 40j is opened.

Here, as described above, the main open-close valves 40a to 40j are provided for the respective evaporating parts 10a to 10j. Accordingly, by opening any one of the main open-close valves 40a to 40j, film forming vapor 18a to 18j produced in any one of the evaporating parts 10a to 10j is introduced into any one of the manifold portions 66, 67, 68, and is discharged through the discharge openings 80, 81, 82 belonging to any one of the opening groups.

For example, the main open-close valve 40a provided to the evaporating part 10a belonging to the first evaporating part group is opened, and other main open-close valves 40b to 40j are maintained in a closed state. Due to such an operation, only the film forming vapor 18a produced in the evaporating part 10a flows into the upper manifold portion 66 through the first supply flow passage 32 of the connecting flow passage 5, and is discharged through all discharge openings 80 belonging to the first opening group.

That is, the film forming material 16a (film forming vapor 18a) which is vaporized or sublimated from the inside of the crucible 22 in the evaporating part 10a passes through the main open-close valve 40a and flows into the branch flow passage 41a from the evaporating part 10a. Then, the film forming material 16a passes through the first supply flow passage 32, and reaches the upper manifold portion 66. The film forming material 16a which reaches the upper manifold portion 66 is discharged through all discharge openings 80.

In the above-mentioned step, in an initial stage immediately after opening the main open-close valve 40a, the film forming vapor 18a discharged through the discharge openings 80 is unstable so that the shutter member 8 prevents the film forming vapor 18a from flowing toward and reaching a substrate 11 side.

Then, when the film forming vapor 18a discharged through the discharge openings 80 is brought into a stable state along with a lapse of a predetermined time A, the shutter member 8 is moved in the horizontal direction by the pneumatic cylinder 95. That is, as shown in FIG. 12A, the openings formed in the shutter member 8 are aligned with the discharge openings 80, 81, 82 so as to open all discharge openings 80, 81, 82 formed in the film forming material discharge part 13.

However, as described previously, the main open-close valves 40a to 40j are provided for the respective evaporating parts 10a to 10j, and the main open-close valves 40a to 40j are selectively opened. Accordingly, specific film forming vapor 18a is injected through specific openings (discharge openings 80) out of the plurality of discharge openings 80, 81, 82.

To be more specific, while the discharge openings 80, 81, 82 are divided into three groups, vapor is discharged only through the discharge openings 80 belonging to the first opening group out of the three groups, and the vapor is not discharged through the discharge openings 81, 82 belonging to other groups.

In the case of the example described above, the film forming vapor 18 discharged through the discharge openings 80 is limited to the film forming vapor 18a produced in the evaporating part 10a, and film forming vapor 18b to 18j produced in other evaporating parts 10b to 10j is not discharged through the discharge openings 80.

Accordingly, although all discharge openings 80, 81, 82 are opened, vapor which is deposited on the substrate 11 is limited to the film forming vapor 18a produced in the evaporating part 10a.

The above-mentioned predetermined time A (a waiting time until the shutter member 8 is opened) is preferably set to 1 second to 10 seconds. By setting the predetermined time A within the above-mentioned range, the stable film forming vapor 18 can be used for forming a film while restraining the consumption of the film forming vapor 18 which does not contribute to the formation of a film to a minimum level.

By bringing the shutter member 8 into an open state, the film forming vapor 18a reaches the substrate 11 so that a film is formed on the substrate 11.

Here, a film forming material belonging to the film forming material group where the film forming material is required to form a film having a large film thickness when formed as a film finally (thick film group) is introduced into the evaporating part 10a where film forming vapor 18a is produced. The evaporating part 10a belongs to the first evaporating part group and is communicably connected to the first opening group. As described previously, the flow restriction 85 having the largest open area is mounted in the discharge openings 80 belonging to the first opening group. Due to such a constitution, an amount of film forming vapor 18a discharged per unit time is large.

Accordingly, the formed film has a large film thickness and hence, the formed film satisfies the required film thickness.

In forming a film, information relating to a film thickness (film forming amount or the like) is monitored by detecting film forming vapor using the film thickness sensor 27 shown in FIG. 1, and the information is always transmitted to the control device 26.

The film thickness sensor 27 is disposed in the inside of the film forming chamber 2, and is exposed under the same vacuum condition as the substrate 11. Film forming vapor 18 which reaches the film thickness sensor 27 is equal to the vapor to be deposited on the substrate 11 for forming a film so that the film forming vapor 18 is supplied from the same manifold portion 66. Accordingly, a film adhering to the film thickness sensor 27 has a strong correlation with a film formed on the substrate 11 and hence, a film thickness of the film adhering to the film thickness sensor 27 accurately reflects a film thickness of the film formed on the substrate 11. In view of the above, the control device 26 can accurately grasp the film forming situation.

When a film having a desired film thickness is formed on the substrate 11 using the film forming material 16a (when the formation of the film is finished), the shutter member 8 is closed as shown in FIG. 12B, and the main open-close valve 40a is also closed.

In the present embodiment, before or after the operation of closing the shutter member 8, only the heating unit 36 which heats the hatch 30 of the manifold portion 66 is stopped. That is, as described previously, only the hatch 30 is heated by other heating unit 36 different from other heating units, and the power source circuit for the heating unit 36 is independent from the power source circuit of another heating unit. Accordingly, only the heating unit 36 for heating the hatch 30 can be stopped by turning off the relay 50 shown in FIG. 8.

As a result, a temperature of only the hatch 30 is rapidly lowered. That is, the temperature of only the hatch 30 is lowered to a temperature below an evaporation temperature of the film forming material 16a (16b to 16j). Accordingly, film forming vapor 18a remaining in the inside of the body portion 37 of the manifold portion 66 is solidified by being brought into contact with the hatch 30 so that the film forming vapor 18a remaining in the inside of the body portion 37 is removed. That is, according to the present embodiment, using the residual vapor removing unit 15 which is constituted of the hatch 30 and the heating unit 36, vapor of a film forming material is solidified or liquefied by cooling the vapor of the film forming material and then is removed in the solidified or liquefied form.

The operation of the heating unit 36 which heats the hatch 30 is started again after a lapse of a fixed time.

Subsequently, another main open-close valve 40 is opened so as to discharge film forming vapor 18 in another evaporating part 10.

For example, the main open-close valve 40f is opened so that film forming vapor 18f in the evaporating part 10f is introduced into the intermediate manifold portion 67 and, then, is discharged through the discharge openings 81 belonging to the second group. Also in this case, in an initial stage immediately after opening the main open-close valve 40f, the shutter member 8 is in a closed state so that the shutter member 8 prevents the film forming vapor 18f from flowing toward and reaching a substrate 11 side.

After a lapse of a predetermined time A, the shutter member 8 is moved in the horizontal direction by the pneumatic cylinder 95. That is, the openings formed in the shutter member 8 are aligned with the discharge openings 80, 81, 82 and hence, all discharge openings 80, 81, 82 formed in the film forming material discharge part 13 are opened.

Also in this case, the main open-close valves other than the main open-close valve 40f are closed and hence, specific film forming vapor 18f is injected through specific openings (discharge openings 81) out of the plurality of discharge openings 80, 81, 82.

To be more specific, vapor is discharged only through the discharge openings 81 belonging to the second opening group, and the vapor is not discharged through the discharge openings 80, 82 belonging to other groups.

The film forming vapor discharged through the discharge openings 81 is limited to the film forming vapor 18f produced in the evaporating part 10f, and film forming vapor 18 produced in other evaporating parts 10a to 10e and film forming vapor 18 produced in other evaporating parts 10g to 10j are not discharged through the discharge openings 81. Accordingly, although all discharge openings 80, 81, 82 are opened, vapor which is deposited on the substrate is limited to the film forming vapor 18f produced in the evaporating part 10f.

Here, a film forming material belonging to the film forming material group where the film forming material is required to form a film having an intermediate film thickness when formed as a film finally (intermediate thick film group) is introduced into the evaporating part 10f where film forming vapor 18f is produced. The evaporating part 10f belongs to the second evaporating part group and is communicably connected to the second opening group. As described previously, the flow restriction 86 having the intermediate open area is mounted in the discharge openings 81 belonging to the second opening group. Due to such a constitution, an amount of film forming vapor 18f discharged per unit time is approximately intermediate.

Accordingly, the formed film has an intermediate film thickness and hence, the formed film satisfies the required film thickness.

When a film having a desired film thickness is formed on the substrate 11 using the film forming material 16f (when the formation of the film is finished), the shutter member 8 is closed as shown in FIG. 12B, and the main open-close valve 40f is also closed.

Then, in the same manner as described previously, before or after the operation of closing the shutter member 8, only the heating unit 36 which heats the hatch 30 of the manifold portion 67 is stopped so as to lower a temperature of only the hatch 30. As a result, film forming vapor 18f remaining in the inside of the body portion 38 of the manifold portion 67 is solidified by being brought into contact with the hatch 30 so that the film forming vapor 18f remaining in the inside of the body portion 38 is removed.

The operation of the heating unit 36 which heats the hatch 30 is started again after a lapse of a fixed time.

For example, when the main open-close valve 40j is opened, film forming vapor 18j in the evaporating part 10j is discharged through the discharge openings 82 belonging to the third group. A film forming material 16 belonging to the film forming material group where the film forming material is required to form a film having a thin film thickness when formed as a film finally (thin film group) is introduced into the evaporating part 10j where film forming vapor 18j is produced. The flow restriction 87 having the smallest open area is mounted in the discharge openings 82 belonging to the third opening group and hence, an amount of film forming vapor 18j discharged per unit time is small.

Accordingly, the formed film has a thin film thickness and hence, the formed film satisfies the required film thickness.

Although the vacuum deposition device 1 of the present embodiment includes three discharge systems, the organic EL device 100 is formed by laminating a large number of thin film layers. Accordingly, it is necessary to form films on the substrate 11 by using the respective discharge systems plural times.

In the vacuum deposition device 1 of the present embodiment, the film forming vapor 18 remaining in the inside of each manifold portion 66, 67, 68 can be removed by lowering only a temperature of a portion (hatch 30) of each manifold portion 66, 67, 68.

Accordingly, in steps for manufacturing one organic EL device 100, even when the same discharge system is used plural times or even when the same discharge system is continuously used, there is no possibility that the film forming vapor 18 is mixed in the inside of each manifold portion 66, 67, 68. That is, although different film forming vapor 18 is introduced into each manifold portion 66, 67, 68 in the present embodiment, there is no possibility that contamination occurs due to mixing of different film forming vapor 18 in the inside of each manifold portion 66, 67, 68.

When the formation of films constituting a predetermined layers is finished, the conveying-out opening not shown in the drawing is opened, and the substrate 11 is conveyed out by the substrate conveyance device 12. When the conveying-in opening (not shown in the drawing) of the film forming chamber 2 is opened, the degree of vacuum in the film forming chamber 2 is slightly reduced.

However, the operation of the pressure reducing unit 7 is continued until the next substrate 11 is conveyed into the film forming chamber 2 so that the degree of vacuum in the film forming chamber 2 is recovered to "an ultra-high vacuum state". Particularly, in the vacuum deposition device 1 of the present embodiment, the most part of the manifold portions 66, 67, 68 is disposed outside the film forming chamber 2 and hence, a volume of the film forming chamber 2 is relatively small whereby a long time is not required for recovering the reduced degree of vacuum to "an ultra-high vacuum state".

In the above-mentioned embodiment, a film is formed on the substrate 11 by selectively opening one of the main open-close valves 40a to 40j. Due to such film forming, one layer can be formed by deposition using only the content of one film forming material. That is, due to such film forming, the single deposition can be performed.

However, the application of the vacuum deposition device 1 of the present embodiment is not limited to the single deposition, and the co-deposition can be also performed using the vacuum deposition device 1. That is, the co-deposition can be performed on the substrate 11 by selecting the plurality of main open-close valves 40a to 40j and by simultaneously opening the selected main open-close valves 40a to 40j.

For example, the co-deposition can be performed in such a manner that the main open/close valve 40b and the main open-close valve 40g are opened so that film forming vapor 18b produced in the evaporating part 10b and film forming vapor 18g produced in the evaporating part 10g are simultaneously discharged, thus performing the deposition on the substrate 11.

In such a case, the film forming vapor 18b is discharged through the discharge openings 80 belonging to the first group, and the film forming vapor 18g is discharged through the discharge openings 81 belonging to the second group.

That is, in the co-deposition step, a main film forming material is evaporated in the single evaporating part 10b belonging to the single discharge system (first discharge system 57, large capacity discharge system), and vapor of the main film forming material is discharged through the discharge openings 80 belonging to the discharge system 57. A sub film forming material is evaporated in the single evaporating part 10g belonging to the single discharge system (second discharge system 58, small capacity discharge system) which differs from the first discharge system 57, and vapor of the sub film forming material is discharged through the discharge openings 81 belonging to the second discharge system 58.

Here, "main film forming material" is a material contained as a main component in a layer formed as a film by co-deposition.

Here, "sub film forming material" is a component which is contained in the layer formed as the film by co-deposition and whose content is smaller than the content of the main film forming material.

In this case, film forming vapor is discharged to the film thickness sensors 27, 28, 29 from the independent manifold portions 66, 67, 68, respectively, and hence, a discharge amount of the main film forming material and a discharge amount of the sub film forming material at the time of performing co-deposition can be detected independently.

Even when two or more main open-close valves 40 of the evaporating parts 10 belonging to the same group are selectively opened, and film forming vapor 18 is mixed with each other and are discharged in a mixed state into each manifold portion 66, 67, 68 belonging to the group, the co-deposition can be performed.

Next, the recommended layer constitution of the organic EL device 100 is described.

Figure 18:
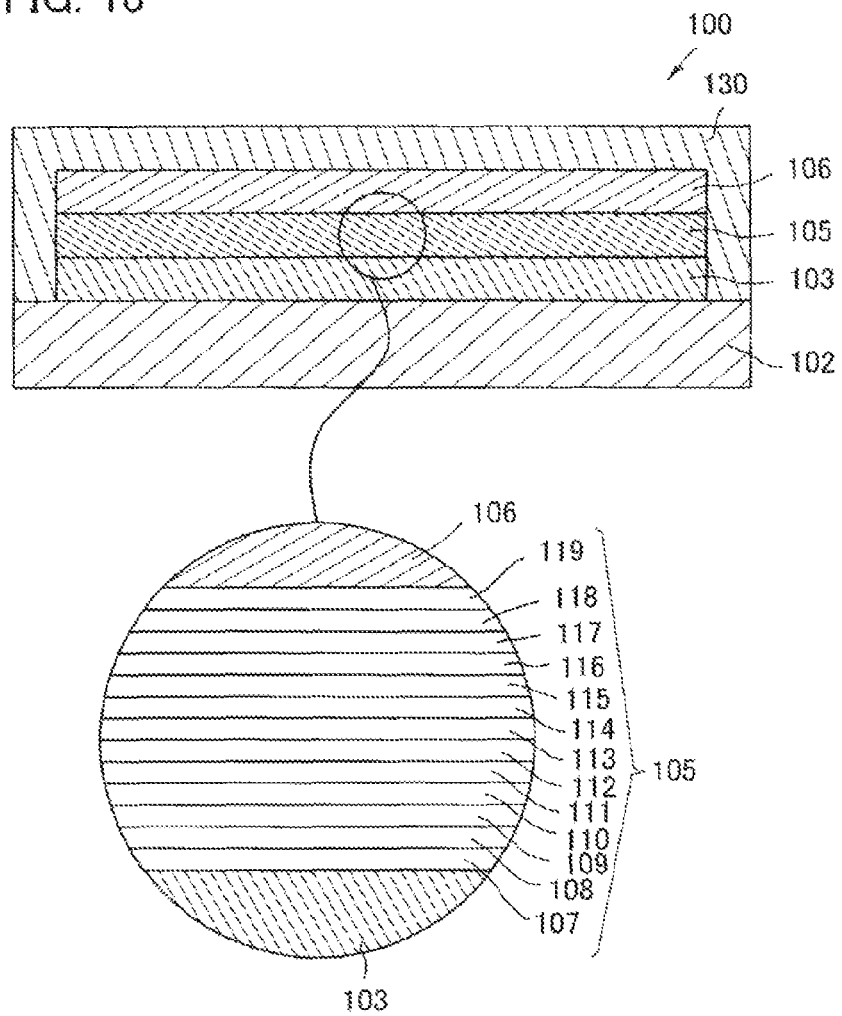
FIG. 18 is a cross-sectional view schematically showing the layer constitution of an organic EL device where films can be formed using the vacuum deposition device shown in FIG. 1, wherein hatching is omitted with respect to a functional layer.

As shown in FIG. 18, the organic EL device 100 is configured such that a first electrode layer 103, a functional layer 105 (light emitting functional layer), and a second electrode layer 106 are laminated on a substrate 102 having light transmitting property, and such layers are sealed by a sealing layer 130.

As shown in FIG. 18 which is an enlarged view, for example, the functional layer 105 may have the tandem structure where a blue light emitting unit and a red/green light emitting unit are electrically connected to each other by way of a connection layer.

The blue light emitting unit is constituted of, in order from a first electrode layer 103 side, a first hole injection layer 107, a first hole transport layer 108, a blue light emitting layer 109, and a first electron transport layer 110.

The red/green light emitting unit is constituted of, in order from the first electrode layer 103 side, a second hole-injection layer 114, a second hole transport layer 115, a red light emitting layer 116, a green light emitting layer 117, a second electron transport layer 118, and an electron-injection layer 119.

The connection layer is constituted of a first connection layer 111, a second connection layer 112, and a third connection layer 113.

From a viewpoint of sufficiently acquiring high uniformity in in-plane film thickness which is an advantageous effect of the present invention with high productivity and high material use efficiency by the vacuum deposition device of the present invention, it is preferable that a total film thickness of each light emitting unit is set to approximately 50 nm to 300 nm, and it is preferable that a film thickness of each light emitting layer is set to approximately 5 nm to 50 nm.

The blue light emitting layer 109 may be a layer made of a host material doped with a blue fluorescent material, the red light emitting layer 116 may be a layer made of a host material doped with a red phosphorescent material, and the green light emitting layer 117 may be a layer made of a host material doped with a green phosphorescent material. It is preferable to adopt such fluorescent phosphorescent hybrid structure from a viewpoint of acquiring an organic EL element having high brightness, high color rendering property and long lifetime.

Further, it is also preferable that the blue light emitting layer 109 be a layer made of a host material doped with a blue phosphorescent material from a viewpoint of acquiring high brightness.

In the organic EL element having such tandem structure, film thicknesses of the respective light emitting layers directly relate to intensities of light emission spectrums of respective colors. The respective light emitting layers are connected to each other in series in the film thickness direction (laminating direction), and the movement of carriers in the in-plane direction is extremely limited compared to the movement of carriers in the film thickness direction. Accordingly, the film thickness of each light emitting layer closely relates to the light emission spectrums of other colors.

With respect to the organic EL element having the hybrid structure where phosphorescence which is light emitted from a triplet exciton having a long lifetime is used, particularly when a red light emitting layer and a green light emitting layer are disposed adjacent to each other or when the red light emitting layer and the green light emitting layer are formed of a single layer, emitted light tends to be shifted to red on a long wavelength side.

Accordingly, it is important to control film thicknesses of the respective light emitting layers as designed to produce desired light. In this respect, with the use of the vacuum deposition device 1 of the present invention, the film thicknesses can be controlled as designed with extremely high accuracy.

The first hole-injection layer 107 and the first hole transport layer 108 may be formed of a single-layered hole injection transport layer, and the second hole-injection layer 114 and the second hole transport layer 115 may be also formed of a single-layered hole injection transport layer.

The first hole-injection layer 107 and the first hole transport layer 108 may be formed of a layer made of a hole transport material or a layer made of a hole transport material doped with an organic p-type dopant. The second hole-injection layer 114 and the second hole transport layer 115 may be also formed a layer made of a hole transport material or a layer made of a hole transport material doped with an organic p-type dopant.

A layer made of an organic electron transport material doped with an organic n-type dopant may be used as the first connection layer 111, for example. A layer made of an organic electron transport material may be used as the second connection layer 112. A layer made of an organic hole transport material doped with an organic p-type dopant may be used as the third connection layer 113.

In forming such a film as a layer which is made of a host material doped with such a dopant or a light emitting material, assuming such a host material or the like as a main film forming material of the present invention and such a dopant or a light emitting material as a sub film forming material of the present invention, it is preferable to singly allocate the main film forming material to evaporating parts belonging to an evaporating part group connected to the opening group of the present invention having a large flow restriction. Further, it is preferable to singly allocate the sub film forming material to evaporating parts belonging to an evaporating part group connected to an opening group of the present invention having a small flow restriction. Accordingly, it is possible to control the co-deposition composition in a stable manner with high accuracy.

It is preferable that the above-mentioned light emitting layer (phosphorescent light emitting layer) which is formed using a phosphorescent material be a layer (co-deposition organic layer) formed by the co-deposition of at least two kinds of compounds including a host material constituting a main film forming material of the present invention and a light-emitting dopant constituting a first sub film forming material contained in a sub film forming material of the present invention.

It is also preferable that the light emitting layer be a layer (co-deposition organic layer) which is formed by the co-deposition of at least three kinds of compounds including electrons and/or a second sub film forming material as a hole transport reinforcing dopant in addition to the above-mentioned two kinds of compounds.

The content of the first sub film forming material is preferably set to 1 to 30 weight %, and is more preferably set to 1 to 10 weight %.

The content of the second sub film forming material is preferably set to 1 to 30 weight %, and is more preferably set to 10 to 30 weight %.

The vacuum deposition device of the present invention can, by allocating the respective film forming materials to the evaporating parts, provide the film forming chamber having three opening groups, that is, a main opening group which is an opening group corresponding to the main film forming material, a first sub opening group which is an opening group corresponding to the first sub film forming material, and a second sub opening group which is an opening group corresponding to the second sub film forming material.

Due to such a constitution, in forming an organic EL device which includes a phosphorescent light emitting layer as a functional layer, the present invention can provide the vacuum deposition device which exhibits excellent controllability in film thickness and can form films at a low cost.

Further, all layers made of organic compounds in the functional layer can be formed in one film forming chamber by allocating a plurality of evaporating parts to evaporating part groups connected to respective opening groups with switching of the evaporating part and by performing a single deposition of a desired layer and performing a co-deposition of layers from a plurality of opening groups.

The vacuum deposition device may include two or more opening groups which discharge vapor in different directions, and the each group may have three sets of opening groups.

It is preferable that all layers of the functional layer 105 are formed by one vacuum deposition device of the present invention by connecting the same evaporating part of the present invention to a plurality of opening groups by way of a supply switching unit of the present invention. That is, it is preferable that the same electron transport material or the same hole transport material is supplied by evaporating the same material from the same evaporating part even when different layers are formed.

The respective layers constituting the functional layer 105 and the second electrode layer 106 are formed by the vacuum deposition device 1.

The substrate 102 is a transparent insulating substrate having light transmitting property and insulating property. A material for forming the substrate 102 is not particularly limited and can be suitably selected from a flexible film substrate, a plastic substrate or the like, for example. Particularly, a glass substrate or a transparent film substrate is preferably used from a viewpoint of transparency and favorable formability.

The substrate 102 expands in plane. To be more specific, the substrate 102 preferably has a polygonal shape or a round shape, and more preferably has a rectangular shape. In the present embodiment, a substrate having a rectangular shape is used.

The shortest side (shortest axis) of the substrate 102 is set to not less than 300 mm. The shortest side of the substrate 102 is preferably set to not less than 350 mm, and more preferably set to not less than 500 mm.

An area of the substrate 102 is set to not less than 900 $cm^2$ (square centimeters) and not more than 4000 $cm^2$ (square centimeters). The area of the substrate 102 is preferably set to not less than 1225 $cm^2$ and not more than 3500 $cm^2$, and more preferably set to not less than 2500 $cm^2$ and not more than 3000 $cm^2$.

A raw material of the first electrode layer 103 is not particularly limited provided that the raw material is transparent and has conductivity. For example, transparent conductive oxide such as indium tin oxide (ITO), indium zinc oxide (IZO), tin oxide ($SnO_2$) or zinc oxide (ZnO) can be used as the raw material for forming the first electrode layer 103. From a viewpoint of effectively drawing light generated from the light emitting layer in the functional layer 105, it is particularly preferable to use ITO or IZO having high transparency. In the present embodiment, ITO is adopted as the raw material for forming the first electrode layer 103.

As a material for forming the first hole-injection layer 107 and the second hole-injection layer 114, a known hole injection material can be used. For example, it is possible to use 1,3,5-tricarbazolyl benzene, 4,4'-bis-carbazolyl biphenyl, polyvinyl carbazole, m-bis-carbazolyl phenyl, 4,4'-bis-carbazolyl-2,2'-dimethylbiphenyl, 4,4',4''-tri(N-carbazolyl) triphenylamine, 1,3,5-tri(2-carbazolyl phenyl)benzene, 1,3,5-tris(2-carbazolyl-5-methoxyphenyl)benzene, bis(4-carbazolyl phenyl) silane, N,N'-bis(3-methylphenyl)-N,N'-diphenyl-[1,1-biphenyl]-4,4'-diamine (TPD), N,N'-di (naphthalene-1-yl)-N,N'-diphenylbenzidine (α-NPD), N,N'-diphenyl-N,N'-bis(1-naphthyl)-(1,1'-biphenyl)-4,4'-diamine (NPB), poly(9,9-dioctyl fluorene-co-N-(4-butylphenyl)diphenylamine) (TFB) or poly(9,9-dioctyl fluorene-co-bis-N,N'-(4-butylphenyl)-bis-N,N-phenyl-1,4-phenylenediamine (PFB) or the like.

As a material for forming the first hole transport layer 108 and the second hole transport layer 115, a known hole transport material can be used. For example, it is possible to adopt benzene, styrylamine, triphenylmethane, porphyrin, triazole, imidazole, oxadiazole, polyarylalkane, phenylenediamine, aryl amine, oxazole, anthracene, fluorenone, hydrazone, stilbene, and derivatives thereof, a monomer, an oligomer, a polymer of a heterocyclic conjugated system of a polysilane compound, a vinylcarbazole compound, a thiophene compound, an aniline compound or the like.

As a material for forming the blue light emitting layer 109, a distyrylarylene derivative, an oxadiazole derivative, a polymer thereof, a polyvinyl carbazole derivative, a polyparaphenylene derivative, a polyfluorene derivative or the like can be used. Among these materials, it is preferable to use a polyvinyl carbazole derivative, a polyparaphenylene derivative, a polyfluorene derivative or the like which is a high molecular material.

As a material for forming the red light emitting layer 116, a coumarin derivative, a thiophene cyclic compound, a polymer thereof, a polyparaphenylene-vinylene derivative, a polythiophene derivative, a polyfluorene derivative or the like can be used. It is particularly preferable to use a polyparaphenylene-vinylene derivative, a polythiophene derivative, a polyfluorene derivative or the like which is a polymer material.

As a material for forming the green light emitting layer 117, a quinacridone derivative, a coumarin derivative, a polymer thereof, a polyparaphenylene-vinylene derivative, a polyfluorene derivative or the like can be used. It is particularly preferable to use a polyparaphenylene-vinylene derivative, a polyfluorene derivative or the like which is a polymer material.

As a material for forming the first electron transport layer 110 and the second electron transport layer 118, a known electron transport material can be used. For example, benzine, styrylamine, triphenylmethane, porphyrin, triazole, imidazole, oxadiazole, poly-arylalkane, phenylenediamine, aryl amine, oxazole, anthracene, fluorenone, hydrazone, stilbene, a derivative thereof, or a monomer, an oligomer or a polymer of a heterocyclic conjugated system such as a polysilane compound, a vinylcarbazole compound, a thiophene compound or an aniline compound can be used.

It is particularly preferable to use a metal complex having a quinoline skeleton or a benzoquinoline skeleton such as tris(8-quinolinolato) aluminum (Alq3), tris(5-methyl-8-quinolinolato) aluminum (Almq3), bis(10-hydroxybenzo[h] quinolinato) beryllium (BeBq2), bis (2-methyl-8-quinolinolato)-4-phenylphenolato-aluminum (BAlq) or the like. Further, besides the above-mentioned materials, a metal complex having an oxazole-based or thiazole-based ligand such as bis[2-(2-hydroxyphenyl)-benzoxazolato] zinc (Zn (BOX) 2) or bis[2-(2-hydroxyphenyl)-benzothiazolato] zinc (Zn (BTZ) 2) can be also used. Further, besides a metal complex, it is possible to use 2-(4-biphenylyl)-5-(4-tert-butylphenyl)-1,3,4-oxadiazole (PBD), 1,3-bis[5-(p-tert-butylphenyl)-1,3,4-oxadiazole-2-yl]benzene (OXD-7), 3-(4-tert-butylphenyl)-4-phenyl-5-(4-biphenylyl)-1,2,4-triazole (TAZ), 3-(4-tert-butylphenyl)-4-(4-ethylphenyl)-5-(4-biphenylyl)-1,2,4-triazole (p-EtTAZ), bathophenanthroline (BPhen), bathocuproine (BCP) or the like.

As a material for forming the electron injection layer 119, a known electron injection material can be used. For example, a compound of alkali metal or alkaline earth metal such as lithium fluoride (LiF), cesium fluoride (CsF) or calcium fluoride ($CaF_2$) can be used. Further as the above-mentioned electron injection layer, a material which is prepared by containing alkali metal or alkaline earth metal in a layer made of a material having electron transport property, for example, a material which contains magnesium (Mg) in Alq3 or the like can be also preferably used.

A material for forming the second electrode layer 106 is not particularly limited provided that the material has conductivity. For example, metal such as silver (Ag) or aluminum (Al) can be named as the material for forming the second electrode layer 106.

According to the vacuum deposition device 1 of the present embodiment, substantially all layers of the organic EL device 100 (excluding the substrate 102, the first electrode layer 103 and the sealing layer 130) can be formed in one film forming chamber 2.

In the above-mentioned embodiment, the evaporating part 10a to 10j is configured such that the crucible 22 is disposed in the evaporation chamber 21. However, the whole evaporation chamber 21 may perform a function of a crucible.

In the above-mentioned embodiment, the film forming material discharge part 13 is arranged horizontally in all cases. However, the present invention is not limited to such a constitution, and the film forming material discharge part 13 may be arranged in a vertical posture.

the above-mentioned embodiment, the extension pipes 75, 76, 77 are mounted on the manifold portions 66, 67, 68. However, for example, the discharge opening 80 may be directly formed on the body portion 37 with respect to the manifold portion 66 at an uppermost stage.

In the above-mentioned embodiment, the explanation has been made with respect to the example where three manifold portions 66, 67, 68 are provided. However, the number of manifold portions can be set as desired, and the number of manifold portions may be four or more, or less than three.

In the above-mentioned embodiment, the constitution having ten evaporating parts 10a to 10j is exemplified. However, the number of evaporating parts 10a to 10j is arbitrary. On the other hand, it is desirable that the number of evaporating parts 10 is nine or more, and it is more preferable that the number of evaporating parts 10 is thirteen. In an actual vapor deposition device, an appropriate number of evaporating parts is approximately twelve to twenty.

In the above-mentioned embodiment, with respect to the film forming materials 16a to 16j charged into the crucibles 22, it is designed that the film forming materials having required film thicknesses which are close to each other are charged into the evaporating parts 10a to 10j belonging to the same group. However, in place of or in addition to such a constitution, using a target discharge amount of vapor per unit time or a target divided pressure of vapor in the film forming chamber with respect to individual film forming materials as references, the film forming materials 16a to 16j may be selected such that the film forming materials 16a to 16j having target discharge quantities or target divided pressures which are close to each other are charged into the evaporating parts 10a to 10j belonging to the same group. It is also recommendable to select the film forming materials such that the film forming materials 16a to 16j having target vapor pressures close to each other in the vicinity of open ends of the discharge openings belong to one group.

In the above-mentioned embodiment, the residual vapor removal unit 15 is provided to prevent the contamination caused by mixing different film forming vapor in the manifold portions 66, 67, 68. That is, in the vacuum deposition device 1, the heating units 35, 36 for maintaining temperatures of the manifold portions 66, 67, 68 are formed into a plurality of systems, and a low-temperature portion is intentionally formed at a portion of the manifold portions 66, 67, 68, thus removing film forming vapor 18a to 18j. As a further developed form of such a constitution, portions of the manifold portions 66, 67, 68 are forcibly cooled so as to collect remaining film forming vapor 18a to 18j.

In the above-mentioned embodiment, the low temperature portion is formed in the body portions 37, 38, 39 of the manifold portions 66, 67, 68. However, the low temperature portion may be formed in other portions.

Figure 13:
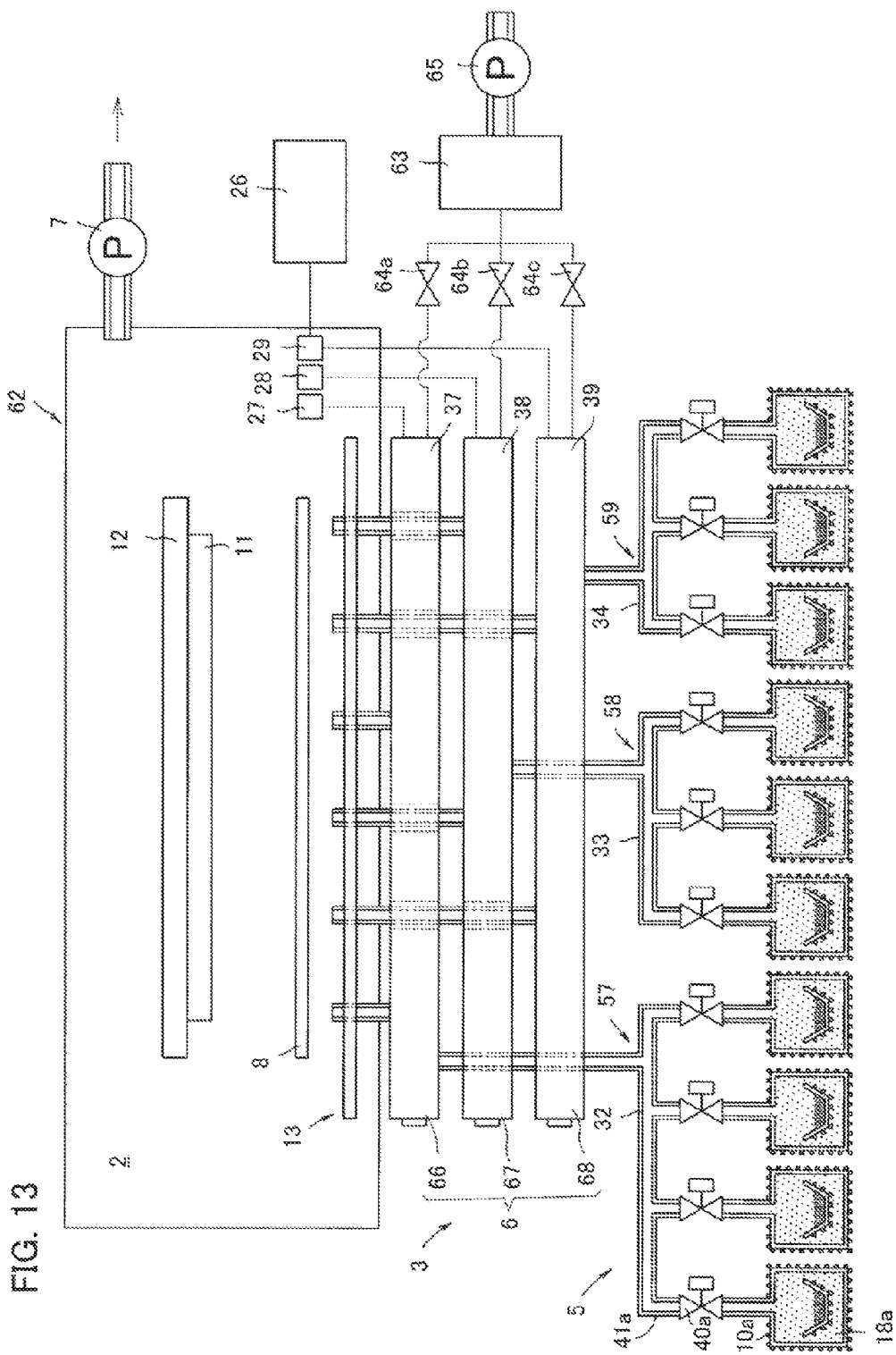
FIG. 13 is a constitutional view showing a vacuum deposition device according to another embodiment of the present invention.
Figure 14:
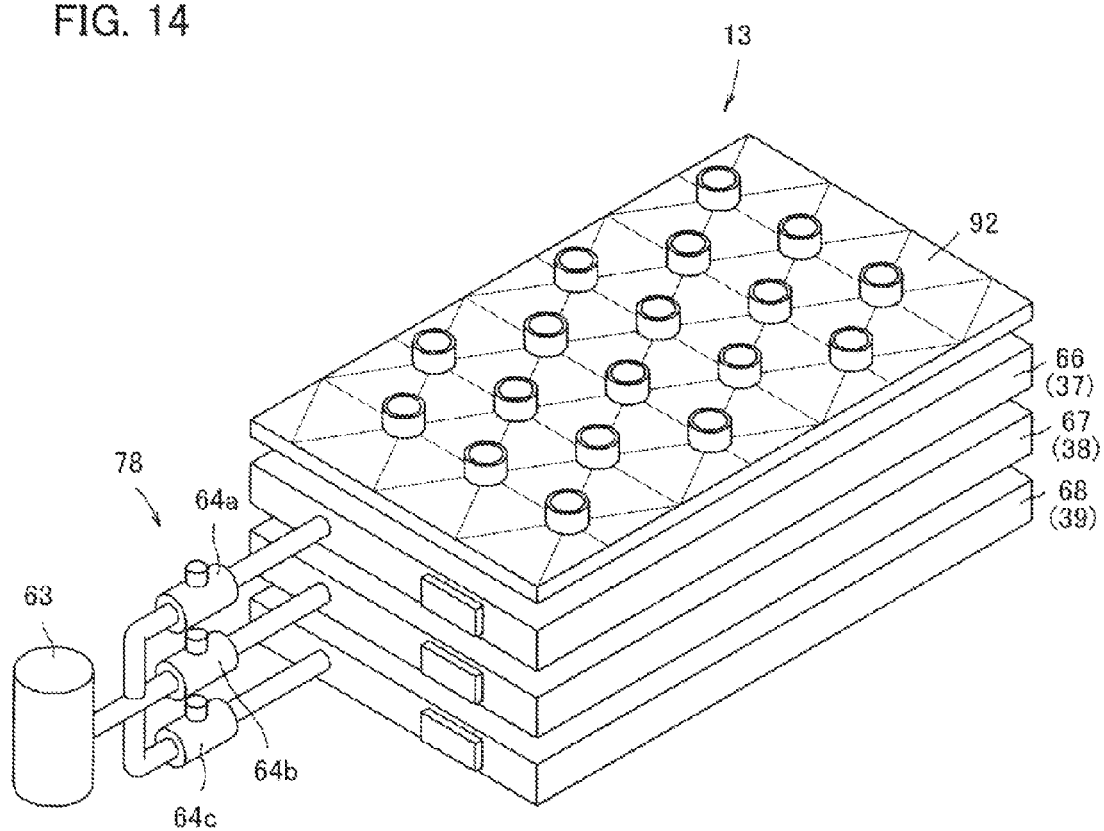
FIG. 14 is a perspective view conceptually expressing manifold portions and a film forming material discharge part of the vacuum deposition device shown in FIG. 13.

For example, in a vacuum deposition device 62 shown in FIG. 13 and FIG. 14, a residual vapor removal unit 78 having the different constitution is adopted. The residual vapor removal unit 78 includes a trap space 63 in addition to the body portions 37, 38, 39. The trap space 63 is always held at a low temperature compared to the manifold portions 66, 67, 68. The trap space 63 and the body portions 37, 38, 39 are connected to each other by pipes. It is desirable that open-close valves 64a, 64b, 64c are provided between the trap space 63 and the body portions 37, 38, 39.

When the open-close valves 64a, 64b, 64c are provided, it is desirable that a pressure reducing unit 65 is additionally provided to the trap space 63 so as to reduce a pressure in the trap space 63 to a pressure substantially equal to a pressure in a film forming chamber 2.

In the vacuum deposition device 62 shown in FIG. 13 and FIG. 14, every time one-time film forming is finished, the open-close valves 64a, 64b, 64c are opened so as to make the manifold portions 66, 67, 68 communicate with the trap space 63. As a result, film forming vapor 18a to 18j which flows into a trap space 63 side from the manifold portions 66, 67, 68 are solidified and collected in the inside of the trap space 63 due to lowering of a temperature. Accordingly, even when the same discharge system is used plural times or even when the same discharge system is continuously used, there is no possibility of mixing of film forming vapor 18 in the manifold portions 66, 67, 68.

In the vacuum deposition device 62 shown in FIG. 13 and FIG. 14, the constitution is exemplified where one trap space 63 is provided for the plurality of manifold portions 66, 67, 68. However, the trap space 63 may be provided to the respective manifold portions 66, 67, 68 individually. When the individual trap spaces 63 are provided, it is unnecessary to provide the open-close valves 64a, 64b, 64c and the pressure reducing unit 65. However, when the individual trap spaces 63 are provided, in the same manner as the above-mentioned hatches 30, it is recommendable to additionally provide a heating unit, and it is desirable to lower only temperatures of the trap spaces 63 after film forming is finished.

Figure 15:
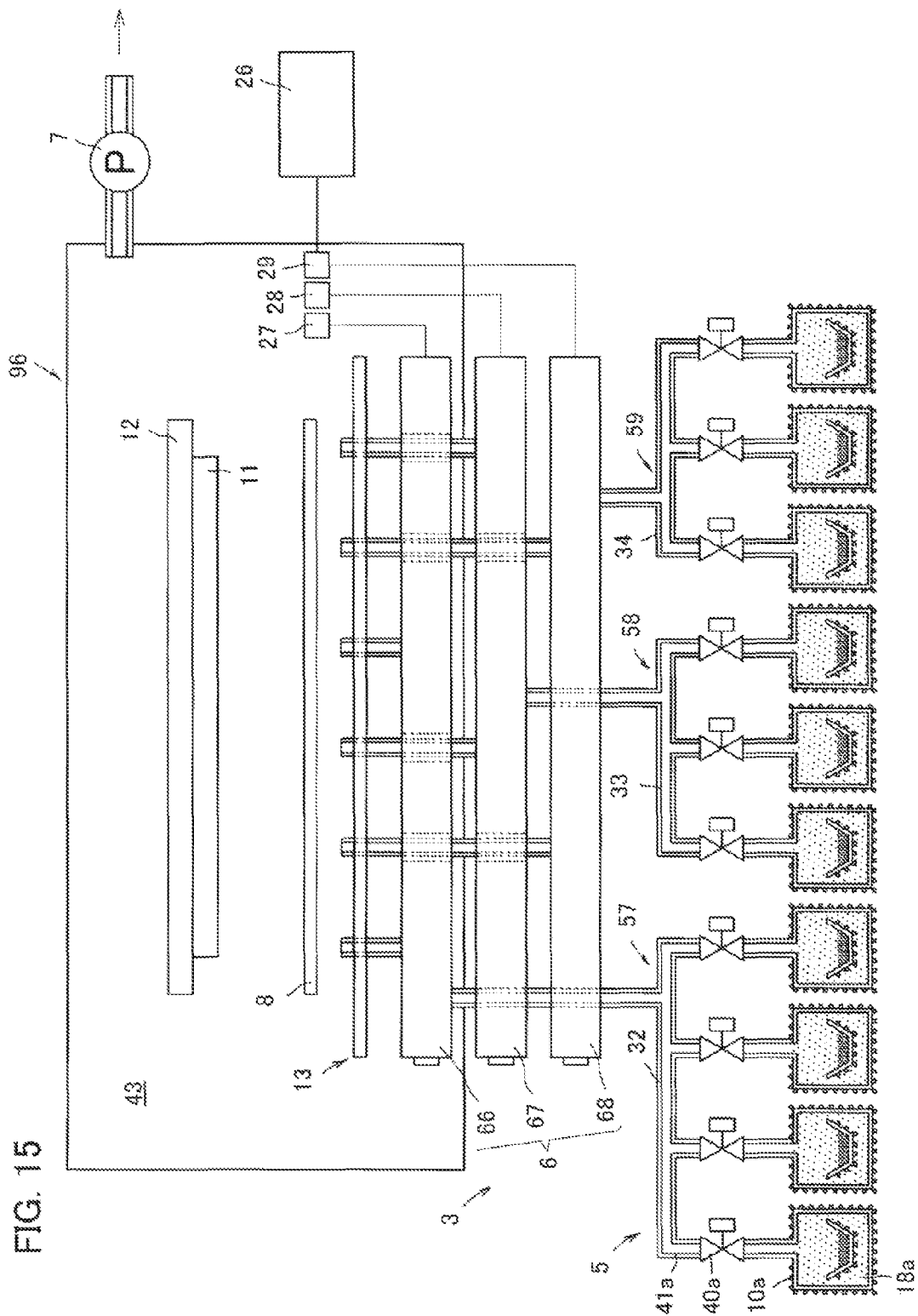
FIG. 15 is a constitutional view showing a vacuum deposition device according to still another embodiment of the present invention.

The vacuum deposition device 1 described above includes three manifold portions 66, 67, 68, and all body portions 37, 38, 39 are arranged outside the film forming chamber 2. However, the present invention is not limited to such a constitution. For example, as in the case of a vacuum deposition device 96 shown in FIG. 15, an upper manifold portion 66 may be arranged in the inside of a film forming chamber 43, and other manifold portions 67, 68 may be arranged outside the film forming chamber 43.

Figure 16:
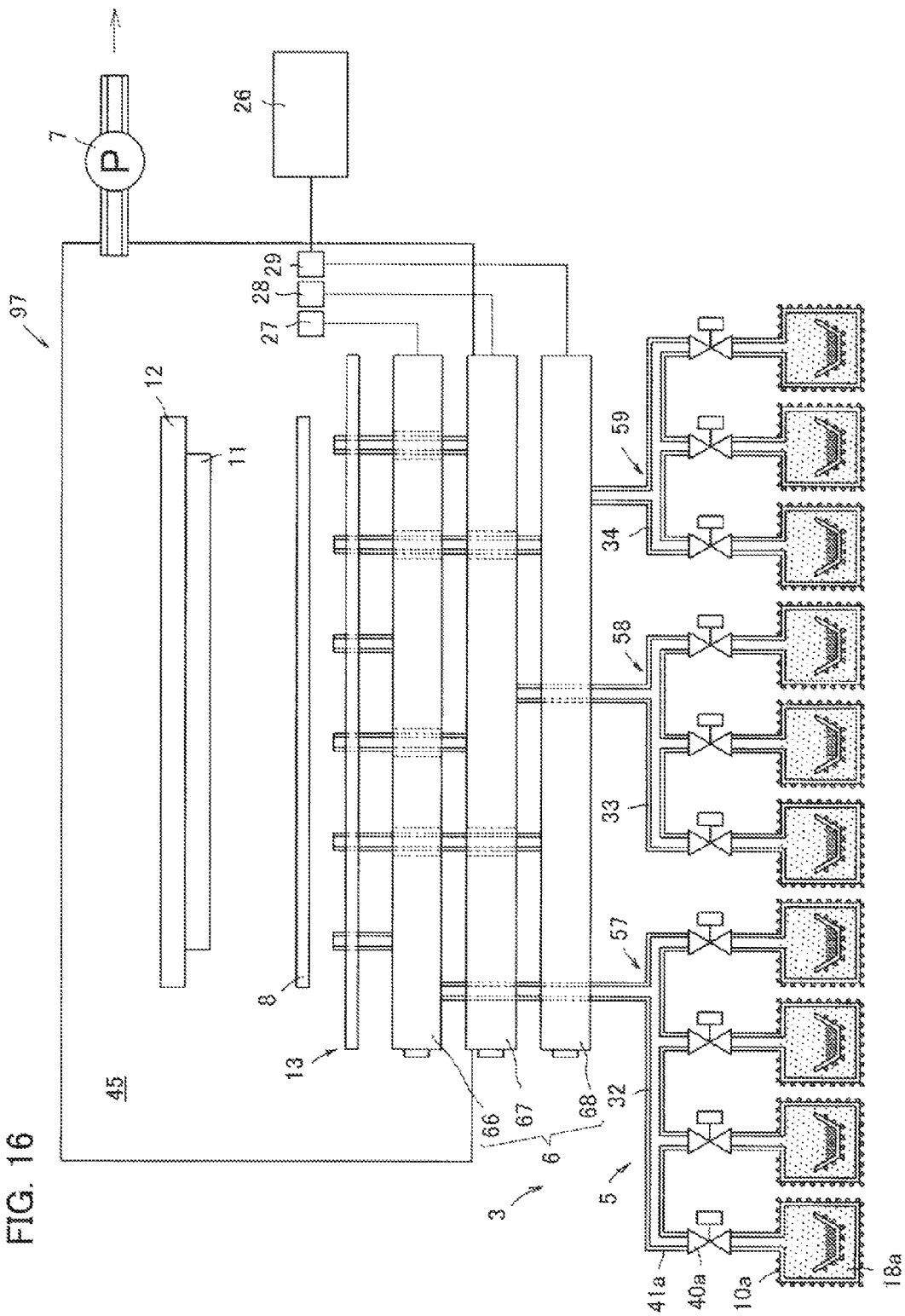
FIG. 16 is a constitutional view showing a vacuum deposition device according to still another embodiment of the present invention.

Further, as in the case of a vacuum deposition device 97 shown in FIG. 16, a body portion 37 of an upper manifold portion 66 and an upper portion of a body portion 38 of the intermediate manifold portion 67 are arranged in the inside of a film forming chamber 45, and a lower portion of the body portion 38 of an intermediate manifold portion 67 and other parts below the lower portion of the body portion 38 may be arranged outside the film forming chamber 45.

Figure 17:
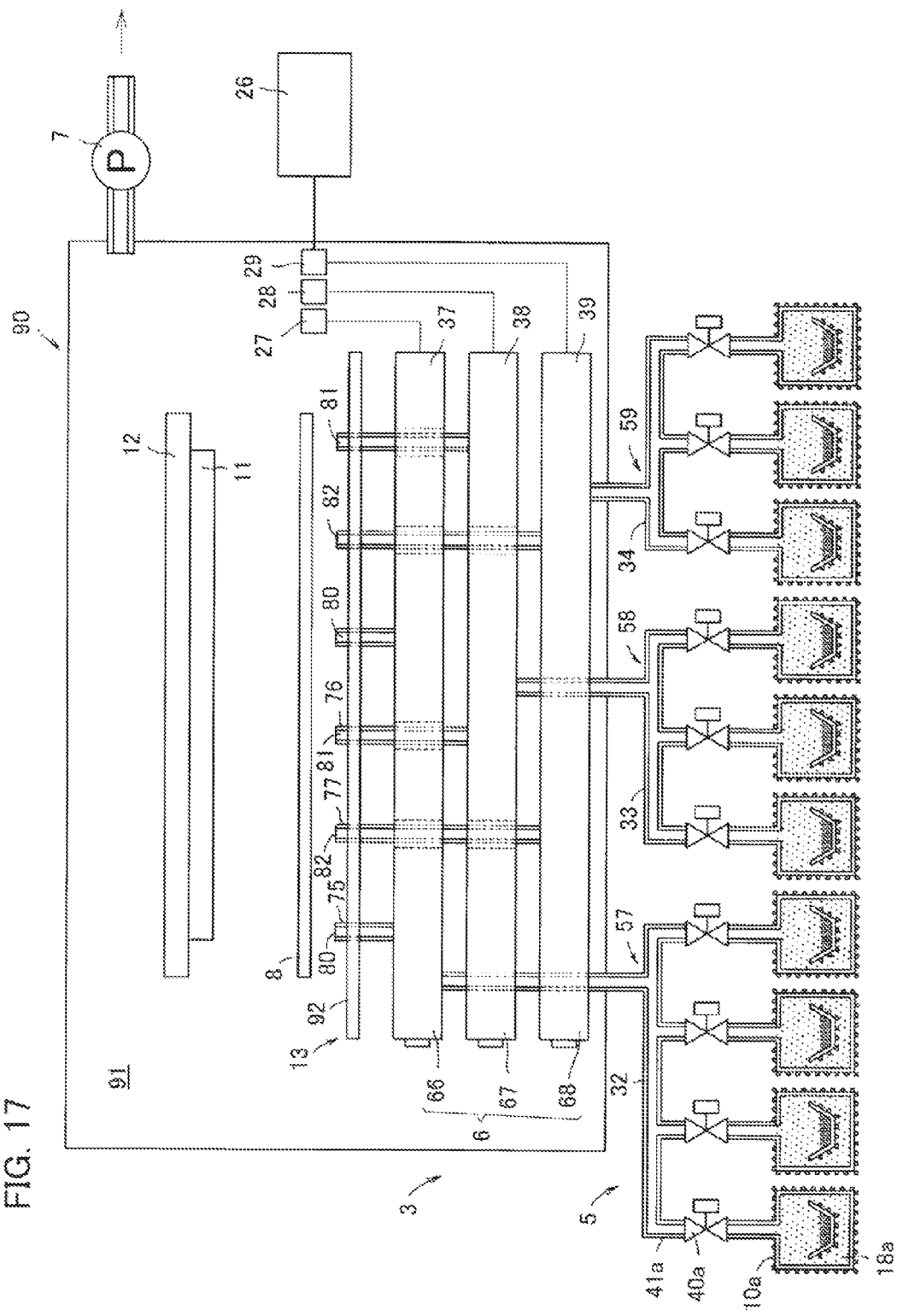
FIG. 17 is a constitutional view showing a vacuum deposition device according to still another embodiment of the present invention.

Further, as in the case of a vacuum deposition device 90 shown in FIG. 17, the whole manifold group 6 may be arranged in the inside of a film forming chamber 91.

In the above-mentioned embodiment, opening diameters and open areas of flow restrictions 85, 86, 87 mounted in discharge openings 80, 81, 82 belonging to individual opening groups are set equal to each other. However, some irregularities may be allowed in the opening diameters and the open areas in the opening group. That is, among the discharge openings belonging to each opening group, the discharge openings having different open areas may be mixed.

For example, with respect to the discharge openings 80, 81, 82 arranged at the center and peripheral portions of the film forming material discharge part 13, in all opening groups, sizes of the flow restrictions 85, 86, 87 may be set different from sizes of the flow restrictions at other portions.

In the above-mentioned embodiment, the flow restrictions 85, 86, 87 are mounted in all discharge openings 80, 81, 82. However, there may be some discharge openings which do not have a flow restriction.

Further, it is not always the case that all opening groups belonging to any discharge system have flow restrictions. Further, in place of or in addition to the flow restriction, extension pipes 75, 76, 77 per se may be formed of a large-diameter pipe or a small-diameter pipe. That is, open areas of the discharge openings 80, 81, 82 may be substantially changed by making inner diameters of the extension pipes 75, 76, 77 different from each other.

In the above-mentioned embodiment, the respective discharge systems 57, 58, 59 have the same number of discharge openings 80, 81, 82. However, the number or the distribution of discharge openings 80, 81, 82 may differ depending on the discharge system.

For example, the number and the distribution of discharge openings may be changed such that the number of discharge openings is large and the discharge openings are uniformly distributed over the whole region of the film forming material discharge part 13 with respect to the opening group belonging to one pipe system, the number of discharge openings is small and the discharge openings are distributed such that the discharge openings are arranged densely on a center side of the film forming material discharge part 13 with respect to the opening group belonging to another pipe system, and the number of discharge openings is large and the discharge openings are distributed densely on peripheral sides of the film forming material discharge parts 13 with respect to the opening group belonging to still another pipe system.

In short, the operation and the advantageous effects of the present invention can be achieved by making any one of the following items different from each other for respective discharge systems.

That is, the operation and the advantageous effects of the present invention can be achieved by making a discharge amount of film forming vapor per unit time or the discharge distribution different for every discharge system.

(1) substantial open area of each discharge opening
(2) substantial total open area of discharge openings
(3) distribution of discharge openings
(4) the number of discharge openings
(5) flow passage resistance of discharge system In the embodiment described heretofore, three systems consisting of the discharge systems 57, 58, 58 are provided, and the heating units 23, 24, 35, 36 are provided to each discharge system. These heating units 23, 24, 35, 36 are all heaters and have only a function of elevating a temperature. However, these heating units 23, 24, 35, 36 may also have a cooling function in addition to such a temperature elevating function.

Figure 19:
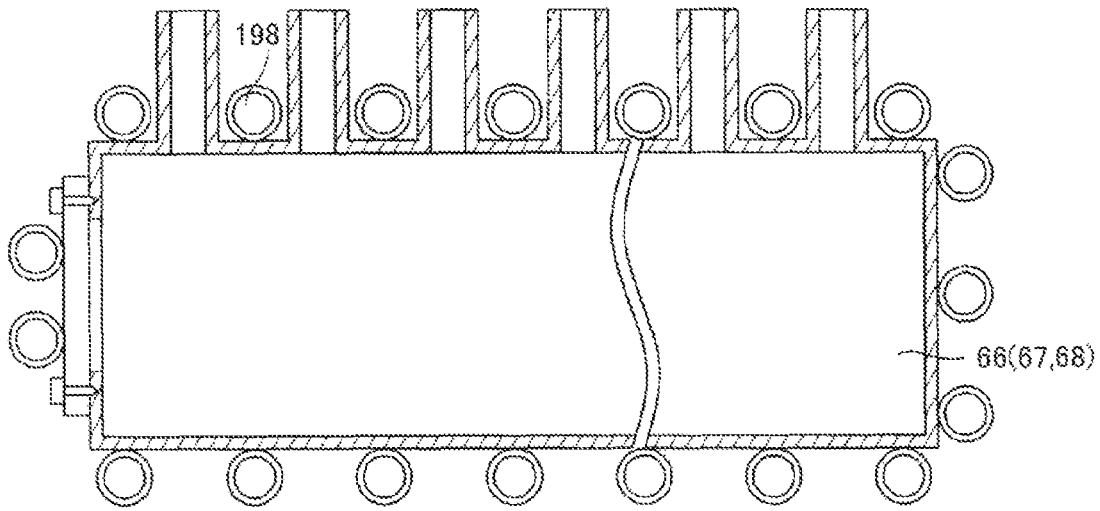
FIG. 19 is a cross-sectional view showing a modification of the manifold portion.
Figure 20:
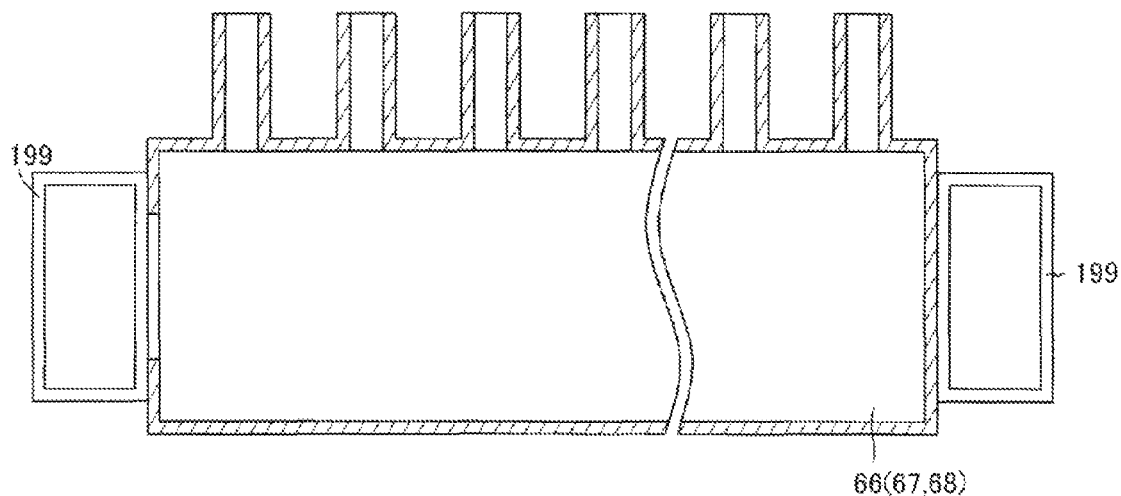
FIG. 20 is a cross-sectional view showing another modification of the manifold portion.
Figure 21:
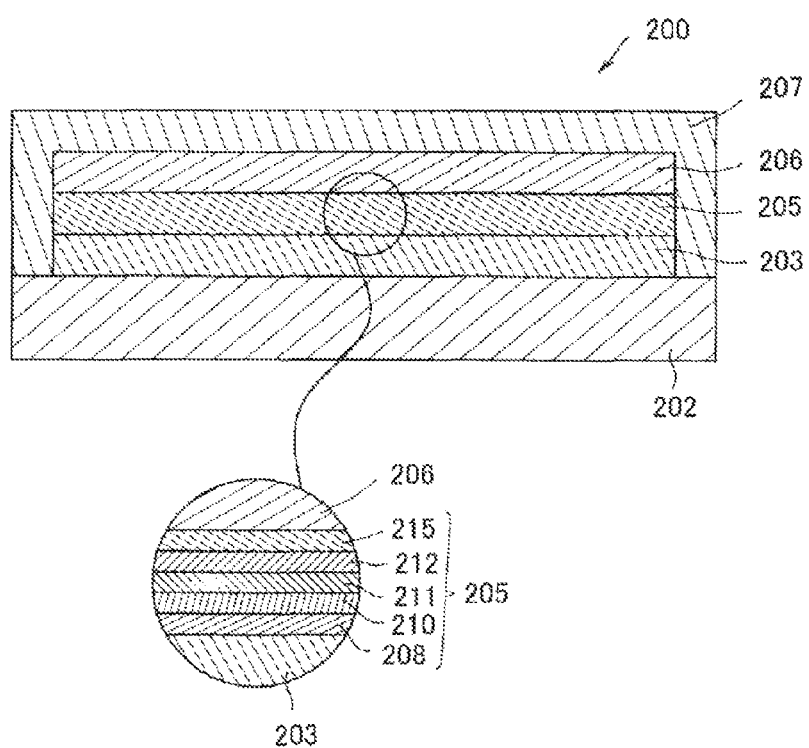
FIG. 21 is a schematic view showing the layer constitution of a general-type organic EL device.

For example, it is also recommendable to provide the constitution which performs a temperature control of the respective manifold portions 66, 67, 68 by adopting a countermeasure such as a measure described in FIG. 19 where a heat medium pipe 198 is provided to the respective manifold portions 66, 67, 68 or a measure shown in FIG. 20 where a heat medium jacket 199 is provided to the respective manifold portions 66, 67, 68. In the present embodiment, the heat medium pipe 198 or the heat medium jacket 199 forms a heat medium flow passage. By making a heat medium of a high temperature or a low temperature pass through the heat medium pipe 198 or the heat medium jacket 199, a temperature control of the respective manifold portions 66, 67, 68 can be performed.

Accordingly, temperatures of the manifold portions 66, 67, 68 can be adjusted to temperatures suitable for film forming materials. Accordingly, in the case where a film forming material having a high vaporization temperature is discharged and, thereafter, a film forming material having a low vaporization temperature is discharged by using the same discharge system, the discharge system can be also cooled and hence, the deposition of a film forming material which is vaporized at a low temperature can be started earlier. That is, a switching time of a film forming material to be discharged can be shortened.

In the vacuum deposition devices 1, 62, 96, 90, 97 of the present embodiment, the sizes of the flow restrictions 85, 86, 87 are changed for the respective discharge systems 57, 58, 58, thus making a discharge state of film forming vapor differ depending on the discharge systems 57, 58, 58. Further, the discharge systems 57, 58, 58 are selected depending on properties of a film forming material and hence, each thin film layer can be formed under a desired film forming condition. Accordingly, it is possible to acquire an advantageous effect that irregularity in thickness of the film is minimally generated.

In the embodiment described heretofore, in the co-deposition step, with respect to components contained in layers formed by co-deposition, a main film forming material and a sub film forming material which differ in content amount are used. However, the present invention is not limited to such materials, and film forming materials which have the same content amount may be also used.

In the embodiment described heretofore, the method is exemplified where the organic EL device of a bottom emission type which draws light from a substrate side is manufactured using the vacuum deposition device of the present invention. However, the present invention is not limited to such a method, and the vacuum deposition device of the present invention is also applicable to an organic EL device of a top emission type where light is drawn from a side opposite to a substrate.

DESCRIPTION OF REFERENCE SIGNS

1, 62, 91, 96, 97 vacuum deposition device
2, 43, 45 film forming chamber 3 discharge circuit
6 manifold group
8 shutter member
10a to 10j evaporating part
11 substrate (base member)
13 film forming material discharge part
15, 78 residual vapor removing unit
16a to 16j film forming material
18a to 18j film forming vapor
21 evaporation chamber
22 crucible
27, 28, 29 film thickness sensor
37, 38, 39 body portion
40a to 40j main open-close valve
46, 47, 48 discharge opening for checking a film thickness
66, 67, 68 manifold portion
73 hollow portion
75, 76, 77 extension pipe
80, 81, 82 discharge opening
85, 86, 87 flow restriction
93 opening
100 organic EL device
105 functional layer
198 heat medium pipe (heat medium flow passage)
199 heat medium jacket (heat medium flow passage)

The invention claimed is:

1. A method of manufacturing an organic EL device where an organic Electro Luminescence (EL) device including a plurality of co-deposition organic layers is manufactured by performing a co-deposition step for forming the co-deposition organic layers by simultaneously discharging a main film forming material and a sub film forming material using a vacuum deposition device a plurality of times, the vacuum deposition device comprising a first single evaporating part belonging to a first single discharge system; a second single evaporating part belonging to a second single discharge system; a film forming chamber where a pressure is reducible and a substrate is disposed; and a film forming material discharge part having a plurality of first discharge openings belonging to the first single discharge system and a plurality of second discharge openings belonging to the second single discharge system, the method comprising for the plurality of times: evaporating the main film forming material in the first single evaporating part belonging to the first single discharge system;

evaporating the sub film forming material in the second single evaporating part belonging to the second single discharge system;

discharging vapor of the main film forming material from the material discharge part to the substrate in the film forming chamber through the first discharge openings belonging to the first single discharge system; and at the same time as discharging vapor of the main film forming material, discharging vapor of the sub film forming material from the material discharge part to the substrate in the film forming chamber through the second discharge openings belonging to the second single discharge system, thereby forming film on the substrate, wherein a plurality of kinds of main film forming materials are selectively charged into evaporating parts which belong to the same evaporating part group, a plurality of kinds of sub film forming materials are selectively charged into evaporating parts which belong to another evaporating part group, and the co-deposition organic layers are formed as films on a substrate by evaporating the respective film forming materials in the evaporating parts.

2. The method of manufacturing an organic EL device according to claim 1, wherein in the co-deposition step, a main film forming material is evaporated in a single evaporating part belonging to a single discharge system, and vapor of the main film forming material is discharged through the discharge openings belonging to the discharge system, while the sub film forming material is evaporated in a single evaporating part belonging to a single discharge system which differs from the discharge system, and vapor of the sub film forming material is discharged through the discharge openings belonging to the discharge system.

3. The method of manufacturing an organic EL device according to claim 1, wherein
the vacuum deposition device comprises: a large capacity discharge system where a total area of discharge openings in an opening group to which the discharge openings belong is large; and a small capacity discharge system where a total area of discharge openings in an opening group to which the discharge openings belong is smaller than the total area of discharge openings of the large capacity discharge system,
the main film forming material is a component contained in a large amount in the layer formed as a film, the sub film forming material is a content contained in a smaller amount than the main film forming material in the layer formed as a film,
the main film forming material is selectively charged into the evaporating part belonging to the large capacity discharge system, and
the sub film forming material is selectively charged into the evaporating part belonging to the small capacity discharge system.

4. The method of manufacturing an organic EL device according to claim 1, wherein the vacuum deposition device is configured such that a film thickness sensor and a checking discharge opening for checking a film thickness are disposed in the inside of the film forming chamber, and a manifold portion and the checking discharge opening for checking a film thickness are communicated with each other, a co-deposition step for forming a co-deposition organic layer is performed by discharging a main film forming material through the discharge openings belonging to one or more discharge systems and, simultaneously, by discharging a sub film forming material through the discharge openings belonging to one or more other discharge systems, and a state where a film is formed by using only the main film forming material and/or a state where a film is formed by using only the sub film forming material is detectable at the time of performing the co-deposition step.

5. The method of manufacturing an organic EL device according to claim 1, wherein the organic EL device is configured such that a functional layer is interposed between two electrode layers,
the functional layer includes a plurality of light emitting layers in each of which a host material which is the main film forming material is doped with a fluorescent material or a phosphorescent material which is the sub film forming material, and
at least two light emitting layers are formed as a film in the inside of the film forming chamber.

* * * * *